(12) United States Patent
Im et al.

(10) Patent No.: US 12,471,425 B2
(45) Date of Patent: Nov. 11, 2025

(54) DISPLAY DEVICE AND METHOD OF MANUFACTURING THE SAME

(71) Applicant: Samsung Display Co., Ltd., Yongin-si (KR)

(72) Inventors: Hyundeok Im, Yongin-si (KR); Jonghyuk Kang, Yongin-si (KR); Daehyun Kim, Yongin-si (KR); Jooyeol Lee, Yongin-si (KR); Hyunmin Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 471 days.

(21) Appl. No.: 18/049,967

(22) Filed: Oct. 26, 2022

(65) Prior Publication Data
US 2023/0066918 A1  Mar. 2, 2023

Related U.S. Application Data

(63) Continuation of application No. 17/061,144, filed on Oct. 1, 2020, now Pat. No. 11,495,717, which is a
(Continued)

(30) Foreign Application Priority Data

Oct. 13, 2017 (KR) ........................ 10-2017-0133484

(51) Int. Cl.
*H10H 20/857* (2025.01)
*H01L 25/075* (2006.01)
(Continued)

(52) U.S. Cl.
CPC ....... *H10H 20/857* (2025.01); *H01L 25/0753* (2013.01); *H05K 1/0295* (2013.01);
(Continued)

(58) Field of Classification Search
CPC H01L 25/0753; H10H 20/857; H10H 20/819; H10H 20/813; H10H 20/8316; H10H 20/812

See application file for complete search history.

(56) References Cited

U.S. PATENT DOCUMENTS 7,381,625 B2     6/2008  Xi et al.
7,612,385 B2 *  11/2009  Kim .................. H10H 20/8582
                                                  257/E23.101
(Continued)

FOREIGN PATENT DOCUMENTS

EP    2 546 900 A1    1/2013
KR   10-0592508 B1    6/2006
(Continued)

OTHER PUBLICATIONS

Extended European Search Report for corresponding European Patent Application No. 17181066.6, dated Nov. 27, 2017, 7 pages.
(Continued)

*Primary Examiner* — Mark W Tornow
(74) *Attorney, Agent, or Firm* — Womble Bond Dickinson (US) LLP

(57) ABSTRACT

A display device includes a substrate, a first electrode extending in a first direction on the substrate, a first partition wall extending in the first direction on a central portion of the first electrode, a second electrode extending in parallel with the first electrode on the substrate, a second partition wall extending in the first direction on a central portion of the second electrode, and a plurality of light-emitting diodes electrically connected between the first electrode and the second electrode.

15 Claims, 23 Drawing Sheets

Related U.S. Application Data continuation of application No. 16/154,856, filed on Oct. 9, 2018, now Pat. No. 10,797,212.

(51) Int. Cl.
| | |
|---|---|
| *H05K 1/02* | (2006.01) |
| *H05K 1/11* | (2006.01) |
| *H10H 20/01* | (2025.01) |
| *H10H 20/812* | (2025.01) |
| *H10H 20/813* | (2025.01) |
| *H10H 20/819* | (2025.01) |
| *H10H 20/831* | (2025.01) |

(52) U.S. Cl.
CPC .......... *H05K 1/0296* (2013.01); *H05K 1/111* (2013.01); *H10H 20/812* (2025.01); *H10H 20/813* (2025.01); *H10H 20/819* (2025.01); *H10H 20/8316* (2025.01); *H10H 20/0364* (2025.01)

(56) References Cited

U.S. PATENT DOCUMENTS

| | | | |
|---|---|---|---|
| 9,112,112 B2 | 8/2015 | Do et al. | |
| 9,287,242 B2* | 3/2016 | Shibata | ............... H01L 25/0753 |
| 9,773,761 B2 | 9/2017 | Do | |
| 9,786,712 B2 | 10/2017 | Fujimoto et al. | |
| 11,063,194 B2 | 7/2021 | Do et al. | |
| 2006/0023451 A1 | 2/2006 | Han et al. | |
| 2008/0111143 A1 | 5/2008 | Ishida et al. | |
| 2008/0251381 A1 | 10/2008 | Shibata et al. | |
| 2011/0033976 A1 | 2/2011 | Di Cioccio et al. | |
| 2011/0089850 A1 | 4/2011 | Shibata et al. | |
| 2011/0254043 A1 | 10/2011 | Negishi et al. | |
| 2012/0007129 A1 | 1/2012 | Beom et al. | |
| 2012/0326181 A1 | 12/2012 | Shibata et al. | |
| 2013/0082271 A1 | 4/2013 | Kanegae | |
| 2014/0124801 A1 | 5/2014 | Lee | |
| 2014/0145237 A1 | 5/2014 | Do et al. | |
| 2014/0159064 A1 | 6/2014 | Sakariya et al. | |
| 2015/0124455 A1 | 5/2015 | Tamura et al. | |
| 2015/0295146 A1 | 10/2015 | Ikegami et al. | |
| 2016/0141457 A1 | 5/2016 | Ha et al. | |
| 2016/0148911 A1 | 5/2016 | Do | |
| 2016/0211245 A1 | 7/2016 | Do | |
| 2017/0317228 A1 | 11/2017 | Sung | |
| 2017/0338372 A1* | 11/2017 | Teraguchi | ............ H10H 20/819 |
| 2017/0358563 A1* | 12/2017 | Cho | ....................... H01L 25/167 |
| 2018/0019369 A1* | 1/2018 | Cho | ....................... H05K 1/181 |
| 2019/0019930 A1* | 1/2019 | Do | ......................... H01L 24/95 |
| 2019/0096858 A1 | 3/2019 | Woo et al. | |
| 2021/0210666 A1 | 7/2021 | Do et al. | |

FOREIGN PATENT DOCUMENTS

| | | |
|---|---|---|
| KR | 10-2012-0120377 A | 11/2012 |
| KR | 10-2012-0122159 A | 11/2012 |
| KR | 10-2015-0006798 A | 1/2015 |
| KR | 10-1490758 B1 | 2/2015 |
| KR | 10-1672781 B1 | 11/2016 |
| KR | 10-1711187 B1 | 3/2017 |
| KR | 10-1713818 B1 | 3/2017 |
| KR | 10-1730977 B1 | 4/2017 |
| WO | WO 2015/005654 A1 | 1/2015 |
| WO | WO 2016/080710 A1 | 5/2016 |
| WO | WO 2017/123039 A1 | 7/2017 |

OTHER PUBLICATIONS

European Patent Office Action for corresponding European Patent Application No. 17 181 066.6, dated Jan. 21, 2019, 8 pages.
Office Action issued in U.S. Appl. No. 15/646,590 by the USPTO, dated Jun. 26, 2018, 14 pages.

* cited by examiner

DISPLAY DEVICE AND METHOD OF MANUFACTURING THE SAME

CROSS REFERENCE TO RELATED APPLICATIONS

This application is a continuation of U.S. patent application Ser. No. 17/061,144, filed Oct. 1, 2020, which is a continuation of U.S. patent application Ser. No. 16/154,856, filed on Oct. 9, 2018, which claims priority to Korean Patent Application No. 10-2017-0133484, filed on Oct. 13, 2017, and all the benefits accruing therefrom under 35 U.S.C. § 119, the content of which in its entirety is herein incorporated by reference.

BACKGROUND

1. Field

Exemplary embodiments relate to a display device and method of manufacturing the same, and more particularly, to a display device including an ultraminiature light-emitting diode ("LED") and a method of manufacturing the same.

2. Description of the Related Art

A light-emitting diode ("LED") has high light conversion efficiency, very low energy consumption, a semi-permanent life, and an environment-friendly characteristic. To use the LED for a light or a display device, it is desired to connect the LED between a pair of electrodes which may apply power to the LED. Methods of connecting the LED to the pair of electrodes may be classified into a method of directly growing an LED on an electrode and a method of separately growing an LED and then arranging the LED on an electrode.

SUMMARY

In a method of separately growing a light-emitting diode ("LED") and then arranging the LED on an electrode, when the LED is an ultraminiature LED of a nano unit, it is difficult to arrange the LED on the electrode.

One or more exemplary embodiments include a display device which may reduce a bonding defect between an ultraminiature LED and electrodes which may occur when the ultraminiature LED independently manufactured is connected between a pair of electrodes, and a method of manufacturing the display device.

Additional exemplary embodiments will be set forth in part in the description which follows and, in part, will be apparent from the description, or may be learned by practice of the presented embodiments.

According to an exemplary embodiment, a display device includes a substrate, a first electrode extending in a first direction on the substrate, a first partition wall extending in the first direction on a central portion of the first electrode, a second electrode extending in parallel with the first electrode on the substrate, a second partition wall extending in the first direction on a central portion of the second electrode, and a plurality of LEDs electrically connected between the first electrode and the second electrode.

In an exemplary embodiment, each of the plurality of LEDs may include a first end contacting an upper surface of the first electrode and a second end contacting an upper surface of the second electrode.

In an exemplary embodiment, the display device may further include a first connection electrode electrically connecting the first electrode to the first end of each of the plurality of LEDs, and a second connection electrode electrically connecting the second electrode to the second end of each of the plurality of LEDs.

In an exemplary embodiment, an interval between the first electrode and the second electrode may be less than a length of an LED of the plurality of LEDs.

In an exemplary embodiment, an interval between the first partition wall and the second partition wall may be equal to or greater than a length of an LED of the plurality of LEDs.

In an exemplary embodiment, a height of each of the first partition wall and the second partition wall may be equal to or greater than a length of an LED of the plurality of LEDs.

In an exemplary embodiment, a width of a cross-section of the first partition wall and the second partition wall may not be reduced in a direction away from the substrate. An angle defined by an upper surface of the first electrode and a lateral surface of the first partition wall may be 90° or less, and an angle defined by an upper surface of the second electrode and a lateral surface of the second partition wall may be 90° or less.

In an exemplary embodiment, each of the first partition wall and the second partition wall may include an organic insulating material in which scattering particles are dispersed.

In an exemplary embodiment, the display device may further include a pixel-defining layer which is arranged over the substrate and in which an opening exposing an emission region is defined, and the plurality of LEDs and the first and second partition walls are arranged in the emission region.

In an exemplary embodiment, the first and second partition walls may include a same material as that of the pixel-defining layer.

In an exemplary embodiment, the display device may further include a capping layer filling the opening of the pixel-defining layer and covering lateral surfaces of the first and second partition walls, a refractive index of a material of the first and second partition walls being greater than a refractive index of a material of the capping layer.

In an exemplary embodiment, a cross-section of the first and second partition walls may have an inverse-tapered shape from an upper surface of the first and second electrodes.

According to one or more embodiments, a display device includes a substrate, a plurality of pixels arranged in a row direction and a column direction over the substrate, a plurality of first power wirings extending in the column direction over the substrate and connected to pixels of the plurality of pixels arranged in a same column, and a plurality of second power wirings extending in the row direction over the substrate and connected to pixels of the plurality of pixels arranged in a same row, wherein each of the plurality of second power wirings includes power electrodes respectively connected to the pixels spaced apart from each other in the row direction and arranged in the same row, and each of the plurality of pixels includes a thin film transistor ("TFT") arranged over the substrate and connected to a corresponding power electrode among the power electrodes, a plurality of first electrodes extending in a first direction over the substrate and electrically connected to a corresponding first power wiring among the plurality of first power wirings, a plurality of first partition walls extending in the first direction on the plurality of first electrodes, a plurality of second electrodes extending in the first direction over the substrate, electrically connected to the TFT, and alternatively arranged with the plurality of first electrodes, a plurality of second partition walls extending in the first direction on the plurality of second electrodes, and a plurality of LEDs electrically connected between a first electrode of the plurality of first electrodes and a second electrode of the plurality of second electrodes adjacent to each other.

In an exemplary embodiment, each of the plurality of first partition walls may be arranged on a central line of a corresponding first electrode among the plurality of first electrodes, and each of the plurality of second partition walls may be arranged on a central line of a corresponding second electrode among the plurality of second electrodes.

In an exemplary embodiment, a length of an LED of the plurality of LEDs may be longer than an interval between the first electrode and the second electrode adjacent to each other, and may be shorter than an interval between a first partition wall of the plurality of first partition walls and a second partition wall of the plurality of second partition walls adjacent to each other.

In an exemplary embodiment, the display device may further include a pixel-defining layer which is arranged over the substrate and in which openings exposing an emission region of the pixels are defined, wherein the plurality of LEDs and the plurality of first and second partition walls are arranged in the emission region, and a material of the plurality of first and second partition walls is same as a material of the pixel-defining layer.

In an exemplary embodiment, the display device may further include a capping layer filling the openings of the pixel-defining layer and covering lateral surfaces of the plurality of first and second partition walls, a refractive index of a material of the plurality of first and second partition walls being greater than a refractive index of a material of the capping layer, a cross-section of the first and second partition walls having an inverse-tapered shape from an upper surface of the plurality of first and second electrodes.

According to one or more embodiments, a method of manufacturing a display device, the method includes forming first and second electrodes extending in a first direction on a substrate such that the first and second electrodes are parallel to each other, forming an organic insulating material layer on the first and second electrodes, forming first and second partition walls and a pixel-defining layer defining an opening exposing an emission region by removing a portion of the organic insulating material layer, the first and second partition walls extending in the first direction on a central portion of the first and second electrodes and being arranged in the emission region, putting a solvent including a plurality of LEDs onto the first and second electrodes, aligning the plurality of LEDs between the first and second electrodes by inducing an electric field between the first and second electrodes, and forming a first connection electrode and a second connection electrode, the first connection electrode electrically connecting one end of each of the plurality of LEDs to the first electrode, the second connection electrode electrically connecting an opposite end of each of the plurality of LEDs to the second electrode.

In an exemplary embodiment, the method may further include forming a capping layer filling the opening of the pixel-defining layer and covering lateral surfaces of the first and second partition walls, a refractive index of a material of the first and second partition walls being greater than a refractive index of a material of the capping layer.

In an exemplary embodiment, the forming the first and second partition walls may include performing an exposure process on the organic insulating material layer having photosensitivity by adjusting exposure energy and a focal position of an exposure beam such that a cross-section of the first and second partition walls has an inverse-tapered shape from an upper surface of the first and second electrodes.

BRIEF DESCRIPTION OF THE DRAWINGS

These and/or other exemplary embodiments will become apparent and more readily appreciated from the following description of the exemplary embodiments, taken in conjunction with the accompanying drawings, in which.

DETAILED DESCRIPTION

Figure 1:
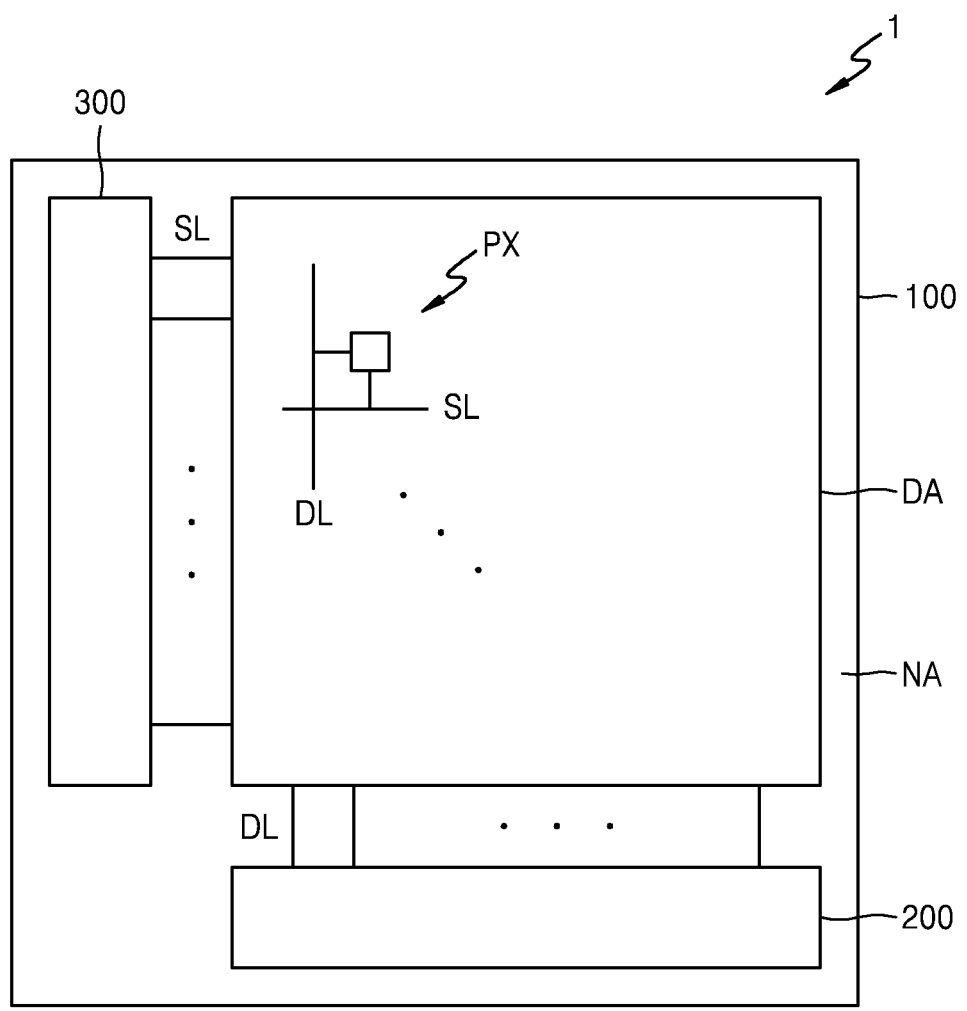
FIG. 1 is a plan view of an exemplary embodiment of a display device.

As the invention allows for various changes and numerous embodiments, specific embodiments will be illustrated in the drawings and described in detail in the written description. Effects and characteristics of invention, and a method of accomplishing them will be apparent by referring to content described below in detail together with the drawings. However, the illustrated exemplary embodiments are not limited to exemplary embodiments below and may be implemented in various forms.

Hereinafter, the invention will be described more fully with reference to the accompanying drawings. For clear description of the invention, parts unrelated to descriptions are omitted, and like reference numerals are used for like or corresponding elements and repeated descriptions thereof are omitted when descriptions are made with reference to the drawings.

It will be understood that when a layer, region, or component is referred to as being "disposed on" another layer, region, or component, it can be directly or indirectly disposed on the other layer, region, or component. That is, for example, intervening layers, regions, or components may be present. Sizes of components in the drawings may be exaggerated for convenience of explanation. In other words, since sizes and thicknesses of components in the drawings are arbitrarily illustrated for convenience of explanation, the invention is not limited thereto.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

It will be understood that although the terms "first", "second", etc. may be used herein to describe various components, these components should not be limited by these terms. These components are only used to distinguish one component from another. As used herein, the singular forms "a", "an" and "the" are intended to include the plural forms as well, unless the context clearly indicates otherwise. It will be understood that when a first element includes or has a second element, the first element does not exclude another element and may include another element unless particularly described otherwise.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

An exemplary embodiment regarding a manufacturing method may be performed according to a process sequence different from a process sequence described in the present specification. For example, although a second process is described after a first process is described, the first process and the second process may be performed substantially at the same time, or terms "corresponding" or "to correspond" in the specification may mean being arranged or connected in a same row and/or column. For example, it will be understood that when a first member is connected to a "corresponding" second member among a plurality of second members, the first member is connected to a second member arranged in a same row and/or a same column as that of the first member. For example, it will be understood that in the case where a plurality of pixel circuits and a plurality of light-emitting diodes are respectively arranged in a row direction and a column direction over a substrate, when a light-emitting diode is connected to a corresponding pixel circuit, the light-emitting diode is connected to a pixel circuit arranged in a same row and a same column as that of the light-emitting diode among the plurality of pixel circuits.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In the accompanying drawings, for example, transformations of an illustrated shape may be expected depending on manufacturing technologies and/or tolerance. Therefore, embodiments should not be construed as being limited to a specific shape of a region illustrated in the present specification. For example, embodiments include changes in a shape caused during a manufacturing process.

FIG. 1 is a plan view of a display device 1 according to an exemplary embodiment.

Referring to FIG. 1, the display device 1 may include a substrate 100 including a display area DA. Scan lines SL, data lines DL, and pixels PX connected to the scan lines SL and the data lines DL may be arranged in the display area DA of the substrate 100. The scan lines SL may extend in a row direction, transfer a scan signal to corresponding pixels PX, and may be spaced apart from each other in a column direction. The data lines DL may extend in the column direction, transfer a data signal to corresponding pixels PX, and may be spaced apart from each other in the row direction. An extension direction of the scan lines SL may be different from an extension direction of the data lines DL, and the invention is not limited thereto. In another exemplary embodiment, the scan lines SL and the data lines DL may extend in a same direction. The scan lines SL and the data lines DL may respectively extend in directions perpendicular to each other.

Each of the pixels PX may be connected to a corresponding scan line SL and a corresponding data line DL. In exemplary embodiments, the pixels PX may be arranged in various patterns such as matrix configurations, zigzag configurations, etc. In an exemplary embodiment, each pixel PX may emit light of one color, for example, may emit one of red light, blue light, green light, and white light. However, the invention is not limited thereto and may emit light of color other than red, blue, green, and white.

The substrate 100 may include a non-display area NA around the display area DA. A first driver 200 and a second driver 300 may be arranged in the non-display area NA. The first driver 200 may generate a data signal and supply a data signal to the data lines DL arranged in the display area DA. The second driver 300 may generate a scan signal and supply a scan signal to the scan lines SL arranged in the display area DA. The first driver 200 and the second driver 300 are driving circuits and may be manufactured as an integrated circuit chip and disposed (e.g., mounted) on the substrate 100, or may be disposed on the non-display area NA of the substrate 100 while the pixels PX are provided in the display area DA of the substrate 100.

Figure 2:
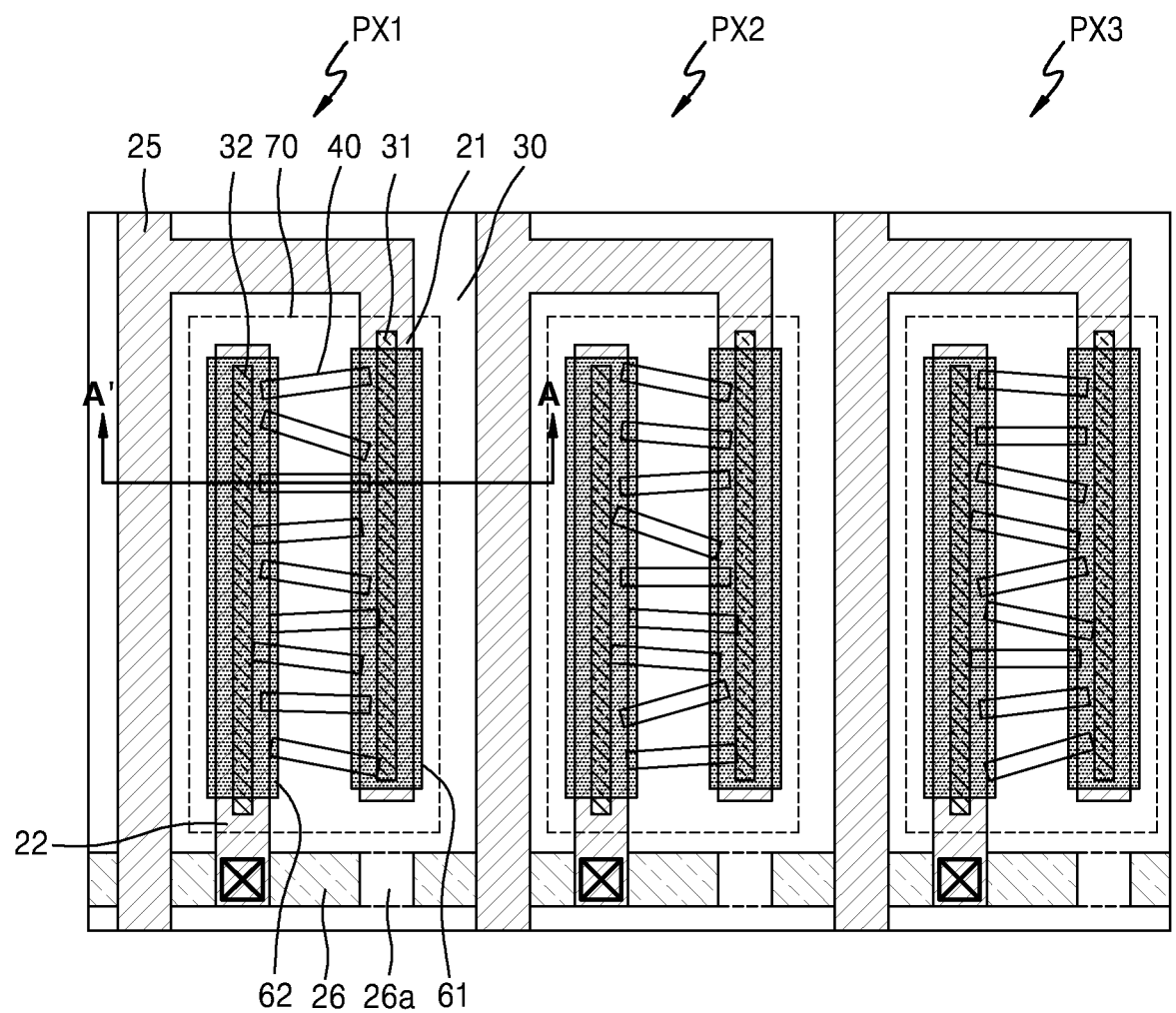
FIG. 2 is a plan view of an exemplary embodiment of a portion of a display area DA.

FIG. 2 is a plan view of a portion of a display area DA according to an exemplary embodiment.

Referring to FIG. 2, pixels PX (refer to FIG. 1) including a first pixel PX1, a second pixel PX2, and a third pixel PX3 respectively emitting light of different colors may be arranged in a row direction and a column direction. The first pixel PX1, the second pixel PX2, and the third pixel PX3 may respectively emit red light, green light, and blue light. However, the invention is not limited thereto, and any combination of colors may be possible as long as the combination produces white light.

First power wirings 25 extending in the column direction over the substrate 100 and second power wirings 26 extending in the row direction over the substrate 100 may be arranged in the display area DA. Each of the first power wirings 25 is connected to pixels PX arranged in a same column, and each of the second power wirings 26 is connected to pixels PX arranged in a same row.

Each of the pixels PX1, PX2, and PX3 may include a first electrode 21, a second electrode 22, and light-emitting diodes ("LEDs") 40 electrically connected between the first electrode 21 and the second electrode 22. The LED 40 may be an LED having a size of a nano unit and may be referred to as an ultraminiature LED. In exemplary embodiments, the LED may have various shapes such as a cylinder and a rectangular parallelepiped. The LED 40 is described below in more detail with reference to FIGS. 3A to 3D.

The first electrode 21 is electrically connected to a corresponding first power wiring 25. According to an exemplary embodiment, the first electrode 21 may be provided as one body with the corresponding first power wiring 25. The second electrode 22 is electrically connected to a corresponding second power wiring 26. According to an exemplary embodiment, the second power wiring 26 may be arranged below the second electrode 22, and the second electrode 22 may be connected to the corresponding second power wiring 26 through a contact plug.

To align the LEDs 40 between the first electrode 21 and the second electrode 22, a voltage may be applied to the first power wirings 25 and the second power wirings 26. After the LEDs 40 are aligned between the first electrode 21 and the second electrode 22, the second power wirings 26 may be divided into a plurality of pieces by openings 26a corresponding to the pixels PX such that light emission of the LEDs 40 of each pixel PX is controlled independently. Pieces of the second power wiring 26 divided by the openings 26a may be referred to as power electrodes. Each of the second power wirings 26 includes the power electrodes, the power electrodes being spaced apart from each other in the row direction and being respectively connected to the second electrodes 22 of the pixels PX arranged in a same row.

The first electrode 21 and the second electrode 22 extend in a first direction (e.g., vertical direction in FIG. 2). Although the first direction in FIG. 2 is the same as an extension direction of the first power wiring 25, that is, the column direction, the invention is not limited thereto and the first direction may be same as the row direction.

A first partition wall 31 extending in the first direction may be arranged on the first electrode 21, and a second partition wall 32 extending in the first direction may be arranged on the second electrode 22.

A pixel-defining layer 30 defining an emission region 70 of a pixel PX may be arranged around the first electrode 21 and the second electrode 22. An opening exposing the emission region 70 of the pixel PX may be defined in pixel-defining layer 30 and the pixel-defining layer 30 may cover the rest of the region excluding the emission region 70. The pixel-defining layer 30 may cover the first power wiring 25 and the second power wiring 26. The LEDs 40 and the first and second partition walls 31 and 32 may be arranged in the emission region 70. At least a portion of the first and second electrodes 21 and 22 may be arranged in the emission region 70.

Each of the pixels PX1, PX2, and PX3 may further include a first connection electrode 61 on the first electrode 21 and the first partition wall 31, and a second connection electrode 62 on the second electrode 22 and the second partition wall 32. The first connection electrode 61 may electrically connect the first electrode 21 to a first end of each of the LEDs 40, and the second connection electrode 62 may electrically connect the second electrode 22 to a second end of each of the LEDs 40.

FIGS. 3A to 3D are views of the LED 40 according to various embodiments.

Figure 3A:
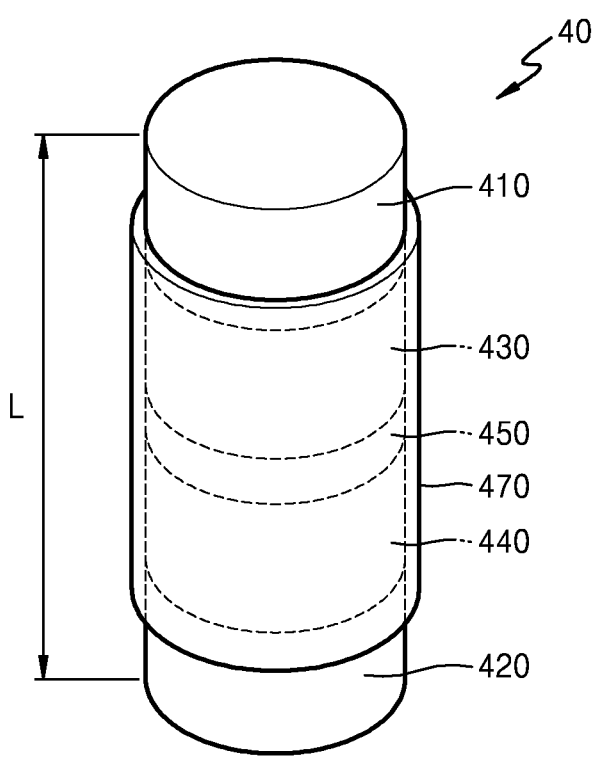
FIGS. 3A to 3D are views of various embodiments of light-emitting diodes ("LEDs")

Referring to FIG. 3A, the LED 40 according to an exemplary embodiment may include a first electrode layer 410, a second electrode layer 420, a first semiconductor layer 430, a second semiconductor layer 440, and an active layer 450 between the first semiconductor layer 430 and the second semiconductor layer 440. As an example, the first electrode layer 410, the first semiconductor layer 430, the active layer 450, the second semiconductor layer 440, and the second electrode layer 420 may be sequentially stacked in a lengthwise direction (e.g., vertical direction in FIG. 3A) of the LED 40. In an exemplary embodiment, the length L of the LED 40 may be about 1 micrometer (μm) to about 10 μm, and a diameter of the LED 40 may be about 0.5 μm to about 500 μm, but the invention is not limited thereto.

In an exemplary embodiment, the first electrode layer 410 and the second electrode layer 420 may be ohmic contact electrodes. However, the first electrode layer 410 and the second electrode layer 420 are not limited thereto and may be Schottky contact electrodes in another exemplary embodiment. In an exemplary embodiment, the first electrode layer 410 and the second electrode layer 420 may include one or more metals such as aluminum, titanium, indium, gold, and silver, for example. Materials included in the first electrode layer 410 and the second electrode layer 420 may be the same with or different from each other.

In an exemplary embodiment, the first semiconductor layer 430 may include, for example, an n-type semiconductor layer, and the second semiconductor layer 440 may include, for example, a p-type semiconductor layer. In an exemplary embodiment, the semiconductor layer may include a semiconductor material such as GaN, AN, AlGaN, InGaN, InN, InAlGaN, and AlInN. In an exemplary embodiment, the first semiconductor layer 430 may be doped with n-type dopants such as Si, Ge, and Sn. In an exemplary embodiment, the second semiconductor layer 440 may be doped with p-type dopants such as Mg, Zn, Ca, Sr, and Ba. However, the invention is not limited thereto, and the first semiconductor layer 430 may include a p-type semiconductor layer and the second semiconductor layer 440 may include an n-type semiconductor layer.

The active layer 450 may be arranged between the first semiconductor layer 430 and the second semiconductor layer 440, and may include, for example, a single or multiple quantum-well structure. The active layer 450 is a region in which an electron and a hole recombine. As an electron and a hole recombine, the active layer 450 may transit to a lower energy level and generate light having a wavelength corresponding thereto. The active layer 450 may be located variously depending on a kind of the LED 40. The invention is not limited to the above exemplary embodiments. In an exemplary embodiment, the LED 40 may further include a separate fluorescent body layer, an active layer, a semiconductor layer, and/or an electrode layer above and below the first semiconductor layer 430 and the second semiconductor layer 440, for example. Light generated from the active layer 450 may be emitted to an external surface and/or both lateral surfaces of the LED 40.

The LED 40 may further include an insulating layer 470 covering an outer surface. In an exemplary embodiment, the insulating layer 470 may cover the active layer 450 and prevent the active layer 450 from contacting the first electrode 21 or the second electrode 22. The insulating layer 470 may prevent reduction of emission efficiency by protecting an outer surface of the LED 40 including an outer surface of the active layer 450.

Figure 3B:
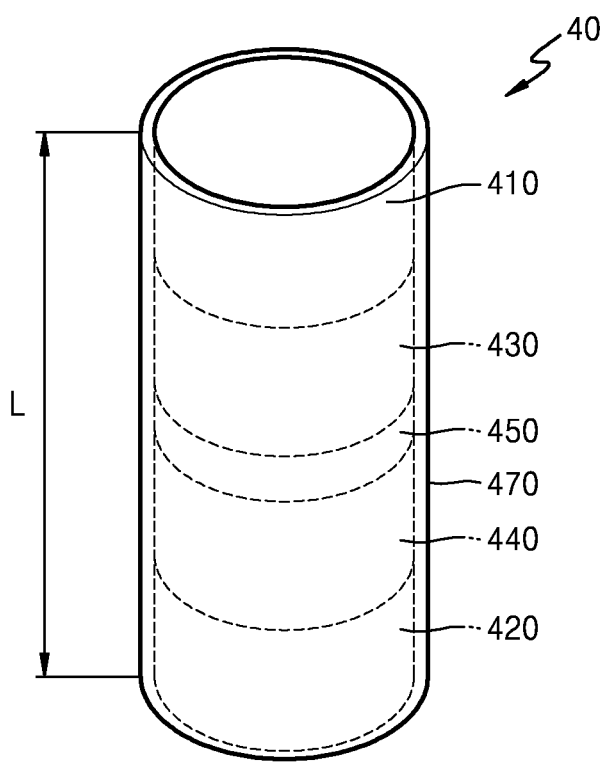

Referring to FIG. 3B, though the LED 40 illustrated in FIG. 3B is different from the LED 40 illustrated in FIG. 3A in that the insulating layer 470 covers an entire outer surface of the LED 40, other configurations are substantially the same as those of FIG. 3A. In the LED 40 illustrated in FIG. 3A, the insulating layer 470 covers a portion of the outer surface of the LED 40. According to an exemplary embodiment, at least one of the first electrode layer 410 and the second electrode layer 420 of the LED 40 may be omitted.

Figure 3C:
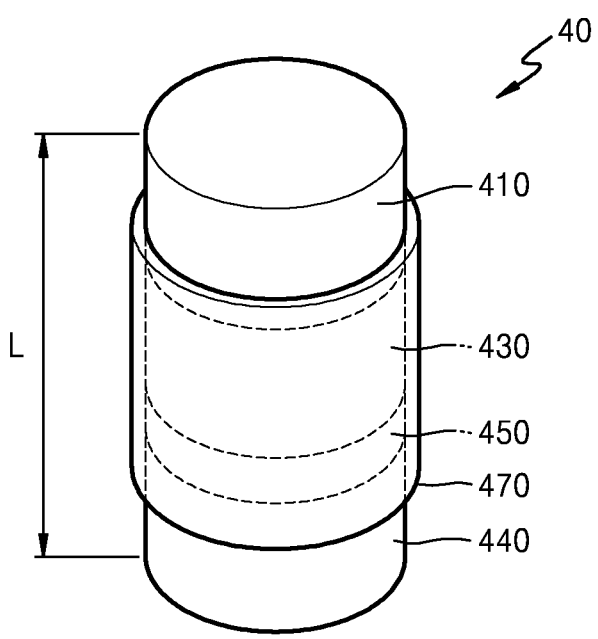

Referring to FIG. 3C, the LED 40 in which one of the first electrode layer 410 and the second electrode layer 420 has been omitted in the LED 40 of FIG. 3A is illustrated. The LED 40 illustrated in FIG. 3C includes only the first electrode layer 410 which is one of the first electrode layer 410 and the second electrode layer 420.

In the LED 40 of FIG. 3C, the insulating layer 470 covers a portion of an outer surface of the first electrode layer 410, and covers a portion of an outer surface of the second semiconductor layer 440. According to another exemplary embodiment, the insulating layer 470 may cover an entire outer surface of the second semiconductor layer 440.

Figure 3D:
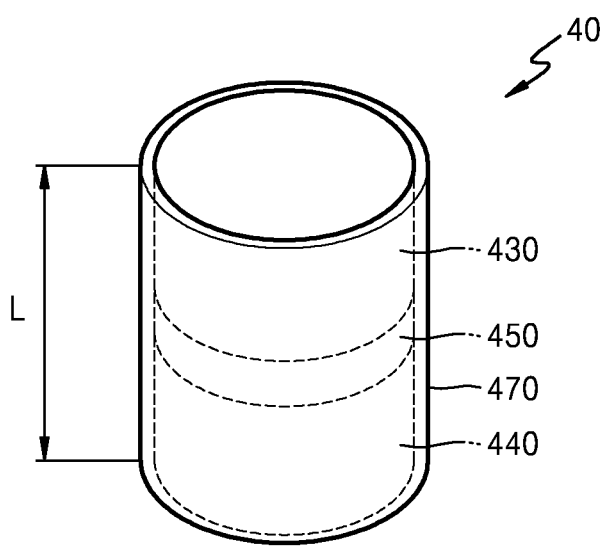

Referring to FIG. 3D, the LED 40 in which both the first electrode layer 410 and the second electrode layer 420 in the LED 40 of FIG. 3A are omitted is illustrated. As illustrated in FIG. 3D, although the insulating layer 470 covers entire outer surfaces of the first semiconductor layer 430, the active layer 450, and the second semiconductor layer 440, the exemplary embodiment is not limited thereto. The insulating layer 470 may cover at least a portion of outer surfaces of the first semiconductor layer 430 and the second semiconductor layer 440 and expose a portion of the outer surfaces.

In the case where the first and second electrode layer 410 and 420 or the first and second semiconductor layers 430 and 440 are exposed by the insulating layer 470, an area through which the first and second electrodes 21 and 22 contact the first and second connection electrodes 61 and 62 may increase.

Opposite ends of each of the LEDs 40 may respectively contact upper surfaces of the first and second electrodes 21 and 22. The LEDs 40 may be spaced apart from each other between the first electrode 21 and the second electrode 22.

In an exemplary embodiment, the first electrode layer 410 or the first semiconductor layer 430 arranged at the first end of the LED 40 may contact an upper surface of the first electrode 21, and the second electrode layer 420 or the second semiconductor layer 440 arranged at the second end of the LED 40 may contact an upper surface of the second electrode 22, for example.

Hereinafter, though the LED 40 of FIG. 3B in which the insulating layer 470 covers an entire outer surface is mainly described for easy understanding of the invention, the description is equally applicable to the LEDs 40 illustrated in FIGS. 3A, 3C, and 3D.

Figure 4A:
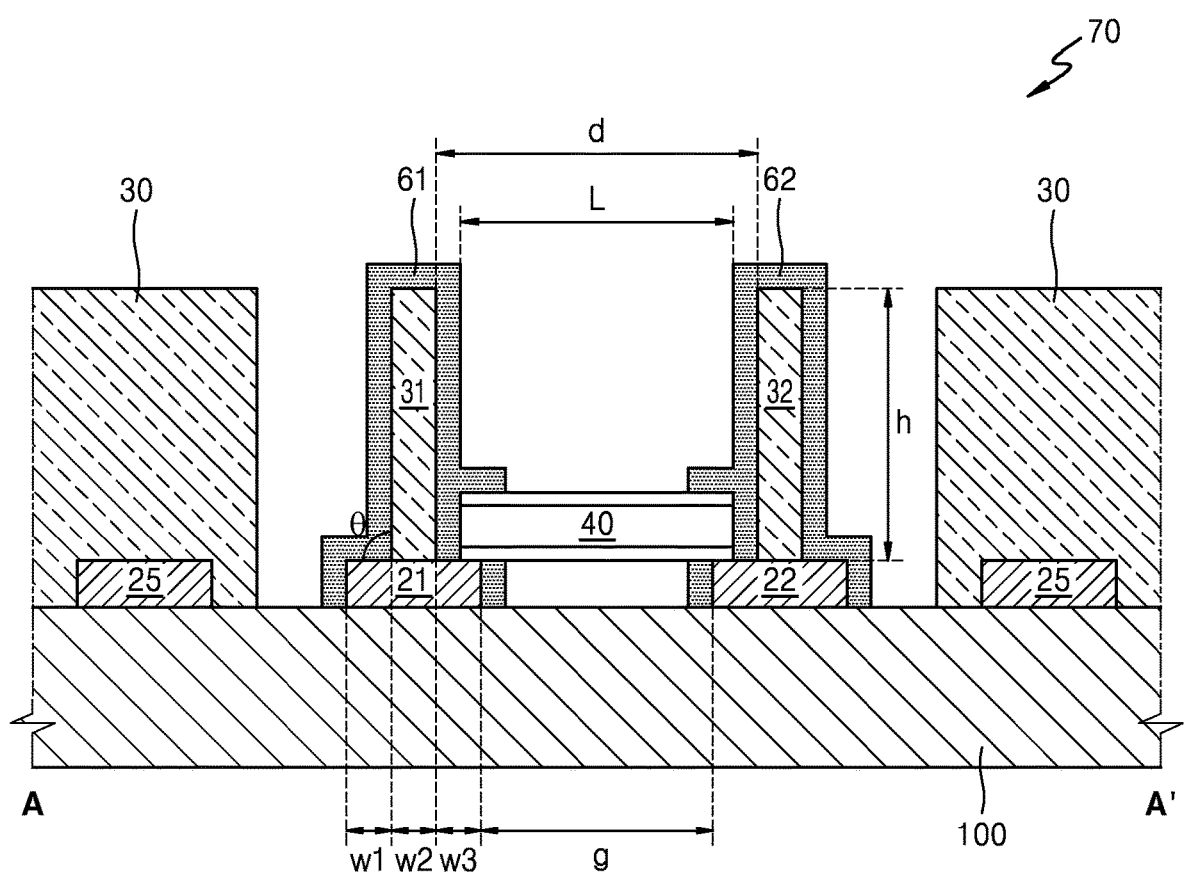
FIG. 4A is a partial cross-sectional view of an exemplary embodiment of the display area taken along line A-A' of FIG. 2.

FIG. 4A is a partial cross-sectional view of the display area taken along line A-A' of FIG. 2 according to an exemplary embodiment.

Referring to FIGS. 2 to 4A, the first electrode 21 and the second electrode 22 may be arranged in parallel with each other in a first direction (e.g., horizontal direction FIG. 4A) over the substrate 100. Both the first electrode 21 and the second electrode 22 may extend in the first direction. The first electrode 21 may be spaced apart from the second electrode 22 by a first interval g. The substrate 100 may be an insulating substrate.

The LED 40 may be arranged on the first electrode 21 and the second electrode 22. The LED 40 may be electrically connected between the first electrode 21 and the second electrode 22. The length L of the LED 40 may be greater than the first interval g between the first electrode 21 and the second electrode 22 such that the first end of the LED 40 is arranged on the first electrode 21 and the second end of the LED 40 is arranged on the second electrode 22. Nevertheless, the first end of the LED 40 may be arranged on the first electrode 21, the second end may be adjacent to the second electrode 22 on the substrate 100, or the first end of the LED 40 may be adjacent to the first electrode 21 on the substrate 100 and the second end may be arranged on the second electrode 22, or both the first end and the second end of the LED 40 may be respectively adjacent to the first electrode 21 and the second electrode 22 on the substrate 100. In this case, the first end of the LED 40 may be electrically connected to the first electrode 21 through the first connection electrode 61, and the second end of the LED 40 may be electrically connected to the second electrode 22 through the second connection electrode 62.

The first power wiring 25 may be arranged on the substrate 100. The first power wiring 25 may be covered by the pixel-defining layer 30 defining the emission region 70.

The first partition wall 31 and the second partition wall 32 may be respectively arranged on the first electrode 21 and the second electrode 22. The first partition wall 31 and the second partition wall 32 may be spaced apart from each other by a second interval d. The second interval d may be equal to or greater than the length L of the LED 40 such that the LED 40 is arranged between the first partition wall 31 and the second partition wall 32. A central line between the first partition wall 31 and the second partition wall 32 may be substantially the same as a central line between the first electrode 21 and the second electrode 22.

The first partition wall 31 and the second partition wall 32 may be respectively arranged along central lines of the first electrode 21 and the second electrode 22. The central lines are lines extending from centers of widths of the first electrode 21 and the second electrode 22 in the first direction. In an exemplary embodiment, the first partition wall 31 may be separated by a first distance w1 from a first edge of an upper surface of the first electrode 21, may have a thickness of a second distance w2, and may be separated by a third distance w3 from a second edge opposite to the first edge of the upper surface of the first electrode 21, for example. A sum of the first to third distances w1, w2, and w3 is the same as a width of the upper surface of the first electrode 21. In this case, the first distance w1 and the third distance w3 may be substantially the same with each other. The second distance w2 corresponding to the thickness of the first partition wall 31 may be about ⅓ of the width of the upper surface of the first electrode 21. The second electrode 22 and the second partition wall 32 may have the same location relation as that of the first electrode 21 and the first partition wall 31.

The first and second partition walls 31 and 32 may be provided during a same process as that of the pixel-defining layer 30 by a same material as that of the pixel-defining layer 30. Upper surfaces of the first partition wall 31 and the second partition wall 32 may be arranged on a substantially same plane as an upper surface of the pixel-defining layer 30. A height h of the first partition wall 31 and the second partition wall 32 may be equal to or greater than the length L of the LED 40. Therefore, the LED 40 may be prevented from being arranged on the first partition wall 31 or the second partition wall 32 while the LED 40 is aligned.

An angle θ defined by the upper surface of the first electrode 21 and a lateral surface of the first partition wall 31 may be 90° or less. Likewise, an angle θ defined by the upper surface of the second electrode 22 and a lateral surface of the second partition wall 32 may be 90° or less. Therefore, a width, that is, a thickness of a cross-section of the first and second partition walls 31 and 32 may not be reduced in a direction away from the substrate 100. FIG. 4A illustrates that a width, that is, a thickness of a cross-section of the first and second partition walls 31 and 32, is constant, and an angle θ defined by the upper surface of the first and second electrodes 21 and 22 and a lateral surface of the first and second partition walls 31 and 32 is 90°, but the invention is not limited thereto. In an exemplary embodiment, a width, that is, a thickness of a cross-section of the first and second partition walls 31 and 32, may increase in the direction away from the substrate 100, an angle θ defined by the upper surface of the first and second electrodes 21 and 22, and a lateral surface of the first and second partition walls 31 and 32 may be less than 90°, and thereby a cross-section of the first and second partition walls 31 and 32 may have an inverse-tapered shape, for example. In an exemplary embodiment, an angle θ defined by the upper surface of the first and second electrodes 21 and 22, and a lateral surface of the first and second partition walls 31 and 32 may be about 70°, for example.

Due to the first partition wall 31 on the first electrode 21 and the second partition wall 32 on the second electrode 22, the LED 40 may be prevented from leaning to the first electrode 21 or the second electrode 22 and thereby prevented from being connected to only one of the first electrode 21 and the second electrode 22 while the LED 40 is aligned. The first and second partition walls 31 and 32 restrict a location of the LED 40 such that the first end of the LED 40 is arranged on the first electrode 21 and the second end of the LED 40 is arranged on the second electrode 22 while the LED 40 is aligned.

The first and second partition walls 31 and 32 may include an insulating material insulated from the first and second electrodes 21 and 22. Therefore, even when a voltage for alignment is applied between the first and second electrodes 21 and 22 while the LED 40 is aligned, an electric field is not concentrated on the first and second partition walls 31 and 32. Therefore, the LED 40 is not given force directed to the first and second partition walls 31 and 32 while the LED 40 is aligned. The first and second partition walls 31 and 32 may include a photosensitive organic material.

The first connection electrode 61 is arranged to cover the first electrode 21, the first partition wall 31, and the first end of the LED 40 arranged on the first electrode 21. The second connection electrode 62 is arranged to cover the second electrode 22, the second partition wall 32, and the second end of the LED 40 arranged on the second electrode 22. In an exemplary embodiment, the first connection electrode 61 and the second connection electrode 62 may include a transparent conductive oxide, for example.

The first electrode layer 410 or the first semiconductor layer 430 of the LED 40 may contact the upper surface of the first electrode 21, and the second electrode layer 420 or the second semiconductor layer 440 may contact the upper surface of the second electrode 22. The first electrode layer 410 or the first semiconductor layer 430 of the LED 40 may be electrically connected to the first electrode 21 through the first connection electrode 61, and the second electrode layer 420 or the second semiconductor layer 440 may be electrically connected to the second electrode 22 through the second connection electrode 62. The first connection electrode 61 may cover the exposed first electrode layer 410 or first semiconductor layer 430 of the LED 40, and the upper surface of the first electrode 21. The second connection electrode 62 may cover the exposed second electrode layer 420 or second semiconductor layer 440 of the LED 40, and the upper surface of the second electrode 22.

Though it is shown that the first and second connection electrodes 61 and 62 cover all of the lateral surfaces and upper surfaces of the first and second partition walls 31 and 32, this is exemplary and the invention is not limited thereto. According to another exemplary embodiment, depending on a manufacturing process and materials of the first and second connection electrodes 61 and 62, the first and second connection electrodes 61 and 62 may not cover the entire lateral surfaces of the first and second partition walls 31 and 32 and may expose at least a portion of the lateral surfaces of the first and second partition walls 31 and 32. According to another exemplary embodiment, the first and second connection electrodes 61 and 62 may not cover the upper surfaces of the first and second partition walls 31 and 32 by removing a portion of a connection electrode material layer arranged on the upper surfaces of the first and second partition walls 31 and 32 during a process of etching the connection electrode material layer for forming the first and second connection electrodes 61 and 62. Also, a height h of the first and second partition walls 31 and 32 may be reduced by performing additional etching, e.g., dry etching on the exposed upper surfaces of the first and second partition walls 31 and 32.

Figure 4B:
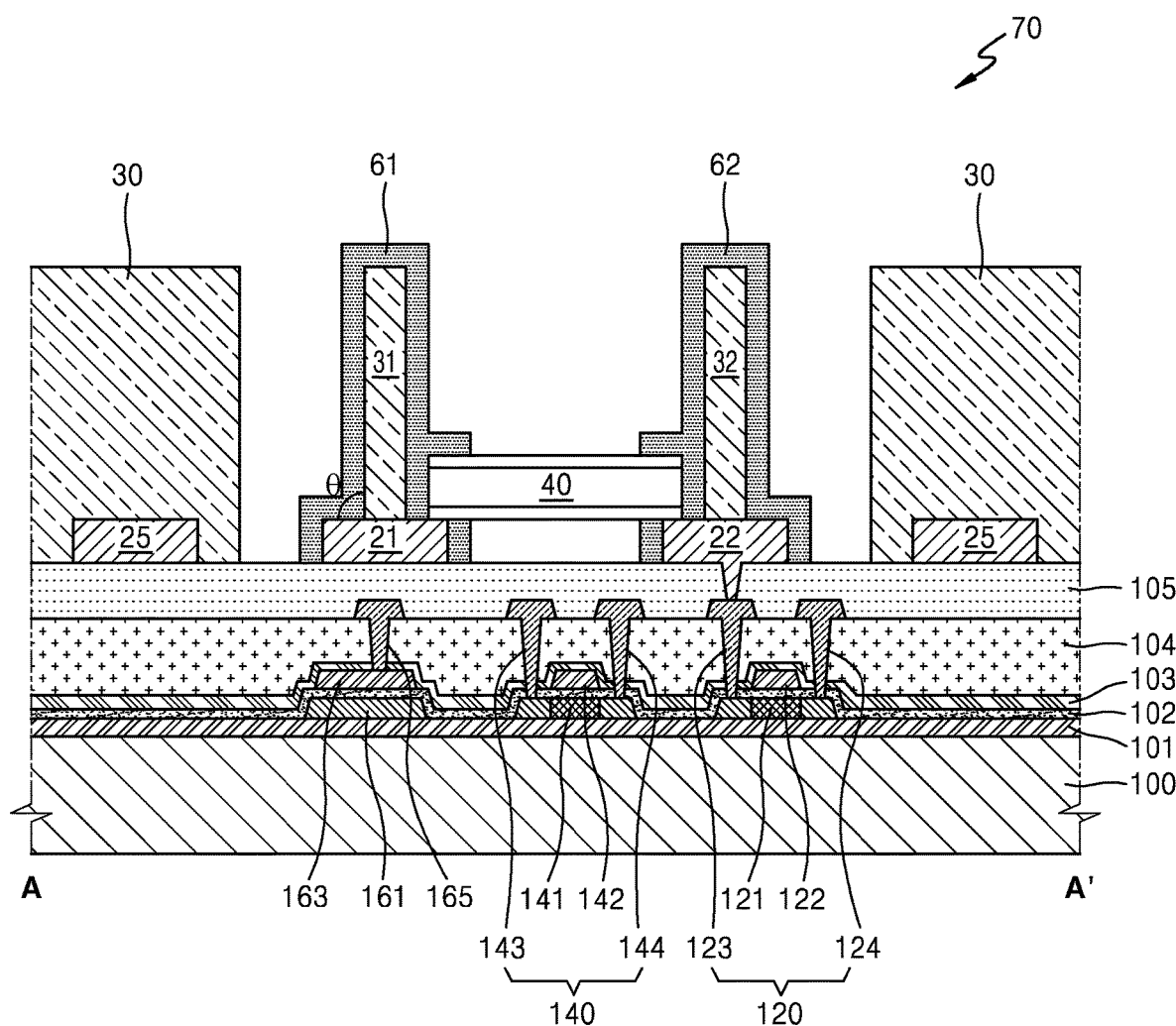
FIG. 4B is a partial cross-sectional view of another exemplary embodiment of the display area taken along line A-A' of FIG. 2.

FIG. 4B is a partial cross-sectional view of the display area taken along line A-A' of FIG. 2 according to another exemplary embodiment.

Referring to FIGS. 2 to 4B, each of the pixels PX1, PX2, and PX3 may further include a pixel circuit electrically connected to the LED 40 and controlling light emission of the LED 40 as illustrated in FIG. 4B. An exemplary embodiment illustrated in FIG. 4B further includes the pixel circuit in the exemplary embodiment illustrated in FIG. 3B and other configurations of FIG. 4B is substantially the same as those of FIG. 3B.

The pixel circuit may include at least one thin film transistor ("TFT") and at least one capacitor. The exemplary embodiment illustrated in FIG. 4B illustrates a first TFT 120 and a second TFT 140, and capacitor electrodes 161 and 163 on a buffer layer 101. The invention is not limited thereto, and the pixel circuit may include three or more TFTs and/or two or more capacitors and have various structures such as additional wirings. The first TFT 120, the second TFT 140, and the capacitor electrodes 161 and 163 may be arranged below the LED 40.

The first TFT 120 may include a first active layer 121, a first gate electrode 122, a first drain electrode 123, and a first source electrode 124. A first gate insulating layer 102 may be arranged between the first gate electrode 122 and the first active layer 121 for insulation therebetween. The first gate electrode 122 on the first gate insulating layer 102 may overlap a portion of the first active layer 121. A second gate insulating layer 103 and an inter-insulating layer 104 may be arranged between the first gate electrode 122, the first drain electrode 123, and the first source electrode 124. The first TFT 120 may be a driving TFT driving the LED 40. The drain electrode 123 may be connected to the second electrode 22.

The second TFT 140 may include a second active layer 141, a second gate electrode 142, a second drain electrode 143, and a second source electrode 144. The first gate insulating layer 102 is arranged between the second gate electrode 142 and the second active layer 141 and may insulate the second gate electrode 142 from the second active layer 141. The second gate electrode 142 on the first gate insulating layer 102 may overlap a portion of the second active layer 141. The second gate insulating layer 103 and the inter-insulating layer 104 may be arranged between the second gate electrode 142, the second drain electrode 143, and the second source electrode 144. The second TFT 140 may be a switching TFT.

The capacitor upper electrode 163 may be arranged in a layer in which the first gate electrode 122 of the first TFT 120 and the second gate electrode 142 of the second TFT 140 are arranged. The capacitor upper electrode 163 may be electrically connected to one of the first drain electrode 123, the first source electrode 124, the second drain electrode 143, and the second source electrode 144 by a connection wiring 165. In an exemplary embodiment, the capacitor upper electrode 163 may be electrically connected to the first source electrode 124 by the connection wiring 165, for example.

The capacitor lower electrode 161 may be arranged in a layer in which the first active layer 121 of the first TFT 120 and the second active layer 141 of the second TFT 140 are arranged. The capacitor lower electrode 161 and the capacitor upper electrode 163 may configure a capacitor. The first electrode 21 may be connected to the first power wiring 25 and supplied with power through the first power wiring 25 as illustrated in FIG. 2.

Figure 5:
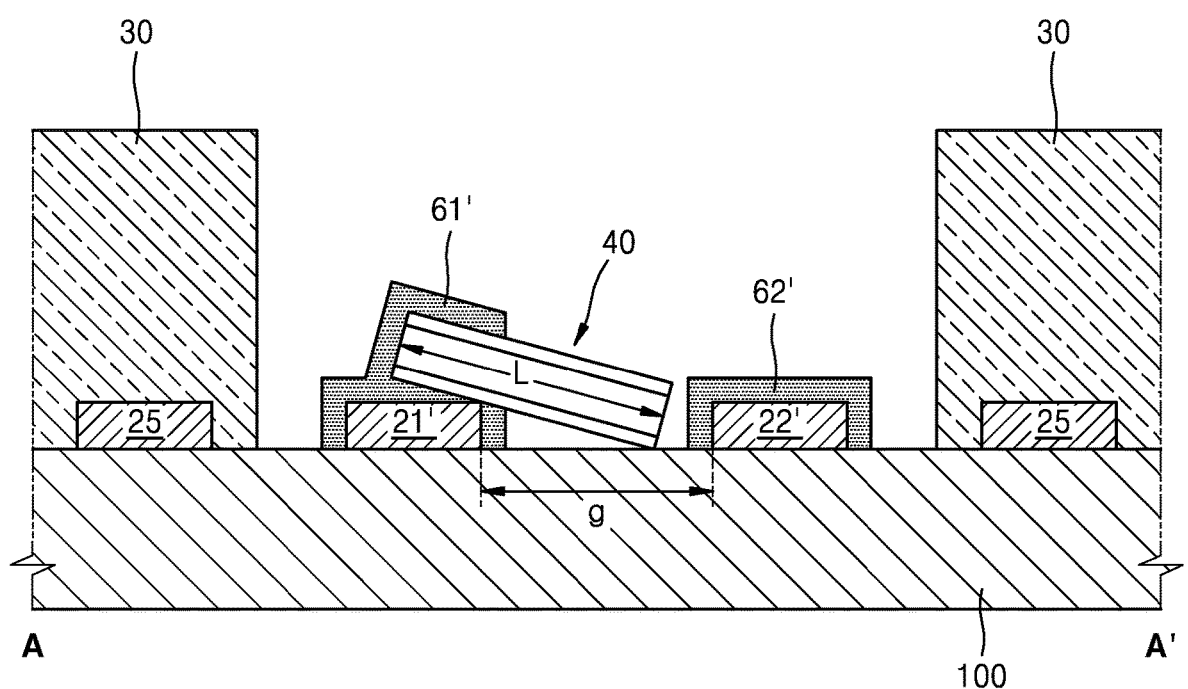
FIG. 5 is a partial cross-sectional view of a comparative example of a display device in which first and second partition walls are absent.

FIG. 5 is a partial cross-sectional view of a display device in which first and second partition walls are absent according to a comparative example.

Referring to the comparative example of FIG. 5, since the first and second partition walls do not restrict a location of the LED 40 even when a separation distance g between a first electrode 21' and a second electrode 22' is less than the length L of the LED 40, the LED 40 may contact only one of the first electrode 21' and the second electrode 22' due to dielectrophoretic ("DEP") force, and thereby a loose contact may occur. In the comparative example of FIG. 5, a first end of the LED 40 may contact a first connection electrodes 61' and a second end of the LED 40 opposite to the first end may not be disposed on a second connection electrode 62', for example.

In contrast, according to an exemplary embodiment, since the first partition wall 31 and the second partition wall 32 are arranged on the first electrode 21 and the second electrode 22, a location of the LED 40 is restricted such that the first end and the second end of the LED 40 are respectively arranged on the first electrode 21 and the second electrode 22. Therefore, an alignment degree of the LED 40 may improve. The alignment degree may be defined as a ratio of the number of LEDs electrically normally connected between the first electrode 21 and the second electrode 22 to the number of all LEDs arranged over the substrate.

Figure 6:
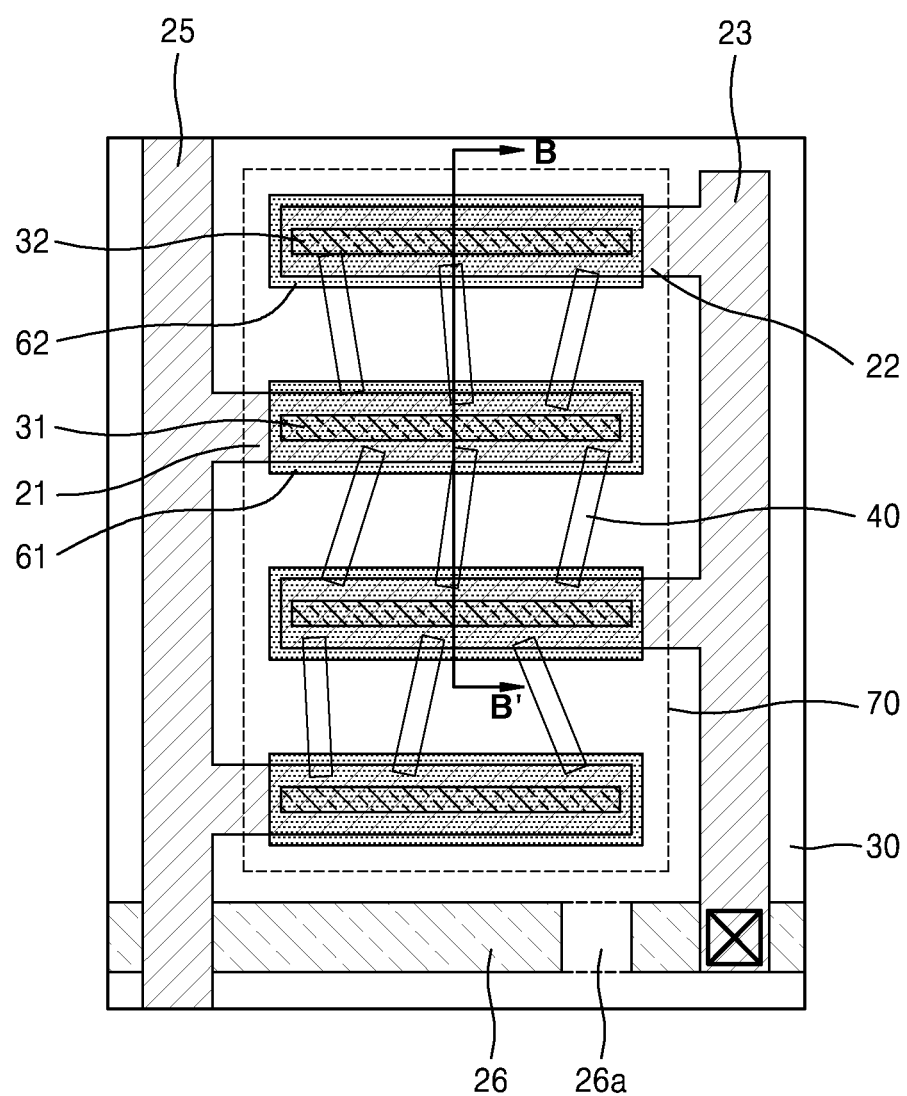
FIG. 6 is a plan view of another exemplary embodiment of a portion of a display area DA.

FIG. 6 is a plan view of a portion of a display area DA (refer to FIG. 1) according to another exemplary embodiment.

Referring to FIG. 6, one pixel PX (refer to FIG. 1) inside the display area DA is illustrated. The pixel PX may be the first pixel PX1 emitting red light, the second pixel PX2 emitting green light, or the third pixel PX3 emitting blue light. However, the invention is not limited thereto and the pixel PX may emit light of a different color.

The pixel PX may include the plurality of first electrodes 21, the plurality of second electrodes 22, and the plurality of LEDs 40 each being electrically connected between the first electrode 21 and the second electrode 22 adjacent to each other. The LED 40 may be an LED having a size of a nano unit and may be referred to as an ultraminiature LED. The LED 40 may have various shapes such as a cylinder and a rectangular parallelepiped.

The pixel PX includes the first power wiring 25 and the second power wiring 26 in which an intermediate portion thereof is cut by the opening 26a. The first power wirings 25 extend in a column direction over the substrate, and each of the first power wirings 25 is connected to pixels PX arranged in a same column. The second power wirings 26 extend in a row direction over the substrate, and each of the second power wirings 26 is connected to pixels PX arranged in a same row.

The first electrodes 21 are electrically connected to the first power wiring 25. According to an exemplary embodiment, the first electrodes 21 may be one body with the first power wiring 25. The second electrodes 22 are electrically connected to the second power wiring 26 through a connection electrode 23. According to an exemplary embodiment, the second power wiring 26 may be arranged below the connection electrode 23. The connection electrode 23 may be connected to a corresponding second power wiring 26 through a contact plug. According to another exemplary embodiment, depending on an arrangement of the first electrodes 21 and the second electrodes 22, the first electrodes 21 may not be directly connected to the first power wiring 25 and may be connected to the first power wiring 25 through a connection electrode.

The first electrodes 21 and the second electrodes 22 extend in a first direction. Though the first direction is the same as an extension direction of the second power wiring 26, that is, a row direction in FIG. 6, the invention is not limited thereto and the first direction may be same as a column direction. The first electrodes 21 and the second electrodes 22 may be alternately arranged in a direction perpendicular to the first direction, and a separation distance between the first electrode 21 and the second electrode 22 adjacent to each other may be constant.

To align the LEDs 40 between the first electrode 21 and the second electrode 22, a voltage may be applied to the first power wirings 25 and the second power wirings 26. After the LEDs 40 are aligned between the first electrode 21 and the second electrode 22, the second power wirings 26 may be divided into a plurality of pieces by the openings 26a corresponding to the pixels PX such that light emission of the LEDs 40 of each pixel PX is controlled independently. Pieces of the second power wiring 26 divided by the openings 26a may be referred to as power electrodes. The second power wiring 26 includes the power electrodes, the power electrodes being spaced apart from each other in the row direction and being connected to the connection electrode 23 of the pixels PX.

The first partition walls 31 extending in the first direction may be arranged on the first electrodes 21, and the second partition walls 32 extending in the first direction may be arranged on the second electrodes 22.

The pixel-defining layer 30 defining the emission region 70 of a pixel PX may be arranged around the first electrodes 21 and the second electrodes 22. The pixel-defining layer 30 may include an opening exposing the emission region 70 of the pixel PX and cover the rest of the region excluding the emission region 70. The pixel-defining layer 30 may cover the first power wiring 25, the second power wiring 26, and the connection electrode 23. The LEDs 40, at least a portion of the first and second electrodes 21 and 22, and the first and second partition walls 31 and 32 may be arranged in the emission region 70.

The pixel PX may further include the first connection electrodes 61 on the first electrodes 21 and the first partition walls 31, and the second connection electrodes 62 on the second electrodes 22 and the second partition walls 32. Each of the first connection electrodes 61 may electrically connect a corresponding first electrode 21 to a first end of each of the LEDs 40, and each of the second connection electrodes 62 may electrically connect a corresponding second electrode 22 to a second end of each of the LEDs 40.

Figure 7A:
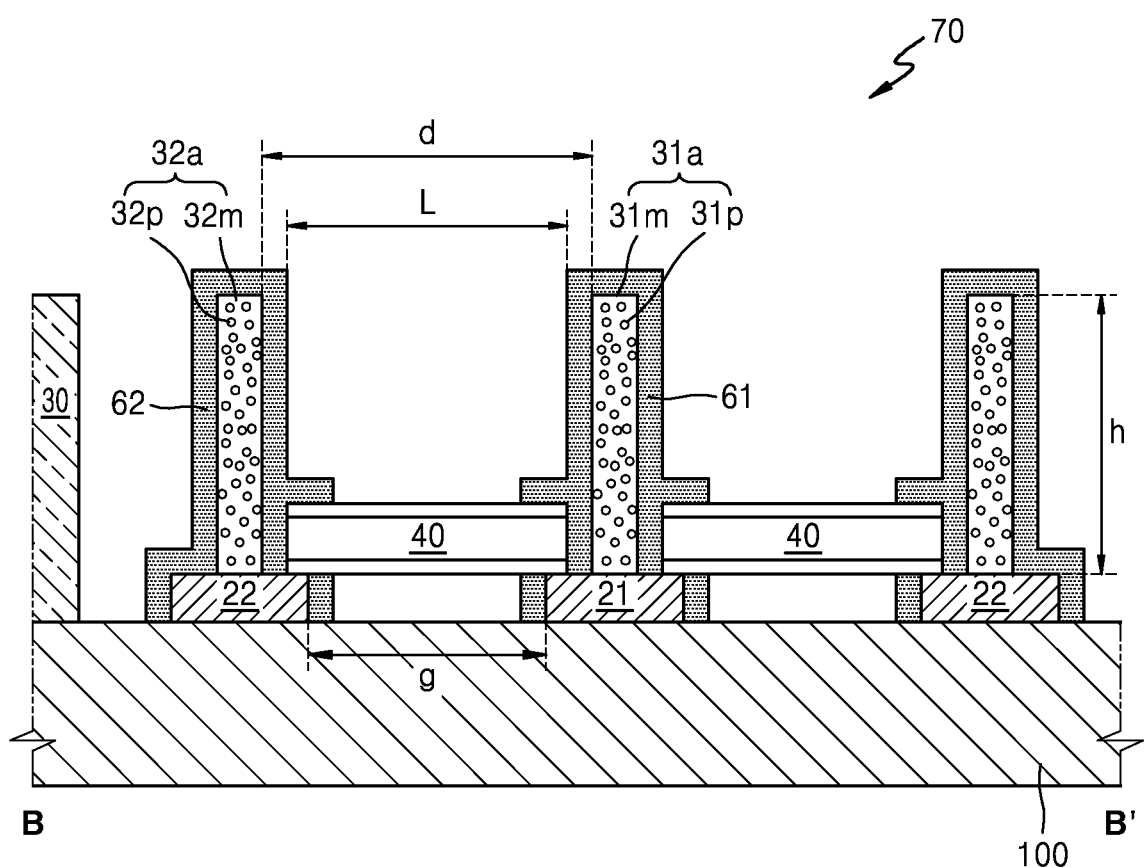
FIG. 7A is a partial cross-sectional view of another exemplary embodiment of the display area taken along line B-B' of FIG. 6.

FIG. 7A is a partial cross-sectional view of the display area taken along line B-B' of FIG. 6 according to another exemplary embodiment.

The exemplary embodiment illustrated in FIG. 7A is substantially the same as the exemplary embodiment illustrated in FIG. 4A except that a plurality of first and second electrodes 21 and 22, and a plurality of first and second partition walls 31a and 32a are provided and the first and second partition walls 31a and 32a respectively include scattering particles 31p and 32p. Same elements are not repeatedly described and only differences are mainly described.

Referring to FIGS. 6 and 7A, the first electrodes 21 and the second electrodes 22 may extend in the first direction on the substrate 100 such that the first electrodes 21 and the second electrodes 22 are parallel to each other, and may be alternately arranged in a direction perpendicular to the first direction. The first electrodes 21 and the second electrodes 22 may be spaced apart from each other by the first interval g. The length L of the LED 40 may be greater than the first interval g between the first electrode 21 and the second electrode 22 such that the first end of the LED 40 is arranged on the first electrode 21 and the second end of the LED 40 is arranged on the second electrode 22.

The substrate 100 may be an insulating substrate. As illustrated in FIG. 4B, the pixel circuit may be arranged on the substrate 100.

The first partition walls 31a and the second partition walls 32a may be respectively arranged on the first electrodes 21 and the second electrodes 22. The first partition wall 31a may be spaced apart from the second partition wall 32a by the second interval d. The second interval d may be equal to or greater than the length L of the LED 40 such that the LED 40 is arranged between the first partition wall 31a and the second partition wall 32a. A central line between the first partition wall 31a and the second partition wall 32a may be substantially the same as a central line between the first electrode 21 and the second electrode 22. The first partition wall 31a and the second partition wall 32a may be respectively arranged along central lines of the first electrode 21 and the second electrode 22.

A height h of the first partition wall 31a and the second partition wall 32a may be equal to or greater than the length L of the LED 40. Therefore, the LED 40 may be prevented from being arranged on the first partition wall 31a or the second partition wall 32a while the LED 40 is aligned. An angle θ defined by the upper surface of the first electrode 21 and a lateral surface of the first partition wall 31a may be 90° or less. Likewise, an angle θ defined by the upper surface of the second electrode 22 and a lateral surface of the second partition wall 32a may be 90° or less. Therefore, a width, that is, a thickness of a cross-section of the first and second partition walls 31a and 32a may not be reduced in a direction away from the substrate 100.

Due to the first and second partition walls 31a and 32a on the first and second electrodes 21 and 22, the LED 40 may be prevented from leaning to the first electrode 21 or the second electrode 22 and thereby prevented from being connected to only one of the first electrode 21 and the second electrode 22 while the LED 40 is aligned. The first and second partition walls 31a and 32a restrict a location of the LED 40 such that the first end of the LED 40 is arranged on the first electrode 21 and the second end of the LED 40 is arranged on the second electrode 22 while the LED 40 is aligned.

The first and second partition walls 31a and 32a may be insulated from the first and second electrodes 21 and 22. The first partition walls 31a may include an organic insulating material 31m in which scattering particles 31p are dispersed, and the second partition walls 32a may include an organic insulating material 32m in which scattering particles 32p are dispersed. In an exemplary embodiment, the scattering particles 32p may be same as the scattering particles 31p, and the organic insulating material 32m may be same as the organic insulating material 31m. However, the invention is not limited thereto, and in another exemplary embodiment, the scattering particles 32p may be different from the scattering particles 31p, and the organic insulating material 32m may be different from the organic insulating material 31m.

In an exemplary embodiment, the organic insulating materials 31m and 32m may be an organic material having light transmittance such as a silicon resin and an epoxy resin. The scattering particles 31p and 32p may increase light extraction efficiency by scattering light incident to the first and second partition walls 31a and 32a. The scattering particles 31p and 32p are not particularly limited as long as they are generally used, and may be, for example, $TiO_2$ or metal particles.

Even when a voltage for alignment is applied between the first and second electrodes 21 and 22 while the LED 40 is aligned, an electric field is not concentrated on the first and second partition walls 31a and 32a having an insulating characteristic. Therefore, the LED 40 is not given force directed to the first and second partition walls 31a and 32a while the LED 40 is aligned. Also, light emitted from the LED 40 to a lateral direction and incident to the first and second partition walls 31a and 32a is scattered by the scattering particles 31p and 32p, and thereby the light may be emitted in a front direction. Therefore, light extraction efficiency of the display device may improve.

The first and second partition walls 31a and 32a including the organic insulating materials 31m and 32m in which the scattering particles are dispersed are applicable to the exemplary embodiments illustrated in FIGS. 2, 4A, and 4B.

Figure 7B:
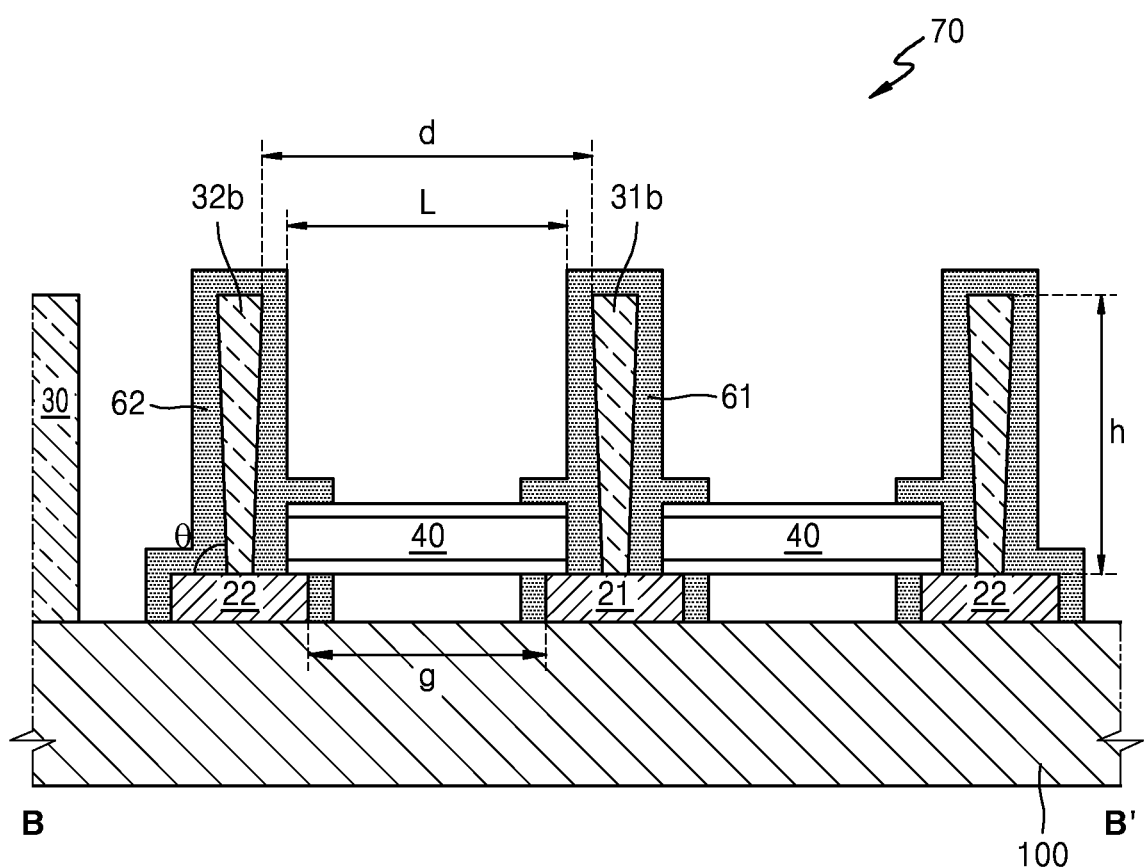
FIG. 7B is a partial cross-sectional view of another exemplary embodiment of the display area taken along line B-B' of FIG. 6.

FIG. 7B is a partial cross-sectional view of the display area taken along line B-B' of FIG. 6 according to another exemplary embodiment.

The exemplary embodiment illustrated in FIG. 7B is substantially the same as the exemplary embodiment illustrated in FIG. 7A except for a cross-sectional shape of first and second partition walls 31b and 32b. Same elements are not repeatedly described and only differences are mainly described.

Referring to FIGS. 6 and 7B, the first electrodes 21 and the second electrodes 22 may extend in the first direction on the substrate 100 such that the first electrodes 21 and the second electrodes 22 are parallel to each other. The first electrodes 21 and the second electrodes 22 may be spaced apart from each other by the first interval g. The length L of the LED 40 may be greater than the first interval g between the first electrode 21 and the second electrode 22 such that the first end of the LED 40 is arranged on the first electrode 21 and the second end of the LED 40 is arranged on the second electrode 22.

The first partition walls 31b and the second partition walls 32b may be respectively arranged on the first electrodes 21 and the second electrodes 22. The first partition wall 31b may be spaced apart from the second partition wall 32b by the second interval d. The second interval d may be equal to or greater than the length L of the LED 40 such that the LED 40 is arranged between the first partition wall 31*b* and the second partition wall 32*b*. A central line between the first partition wall 31*b* and the second partition wall 32*b* may be substantially the same as a central line between the first electrode 21 and the second electrode 22. The first partition wall 31*b* and the second partition wall 32*b* may be respectively arranged along central lines of the first electrode 21 and the second electrode 22.

A height h of the first partition wall 31*b* and the second partition wall 32*b* may be equal to or greater than the length L of the LED 40. Therefore, the LED 40 may be prevented from being arranged on the first partition wall 31*b* or the second partition wall 32*b* while the LED 40 is aligned.

An angle θ defined by the upper surface of the first and second electrodes 21 and 22 and a lateral surface of the first and second partition wall 31*b* and 32*b* may be an acute angle. In an exemplary embodiment, the angle θ may be, for example, about 70°. Therefore, a width, that is, a thickness of a cross-section of the first and second partition walls 31*b* and 32*b* increases in a direction away from the substrate 100, and thereby the cross-section of the first and second partition walls 31*b* and 32*b* may have an inverse-tapered shape from an upper surface of the first and second electrodes 21 and 22.

Due to the first and second partition walls 31*b* and 32*b* on the first and second electrodes 21 and 22, the LED 40 may be prevented from leaning to the first electrode 21 or the second electrode 22 and thereby prevented from being connected on only one of the first electrode 21 and the second electrode 22 while the LED 40 is aligned. The first and second partition walls 31*b* and 32*b* restrict a location of the LED 40 such that the first end of the LED 40 is arranged on the first electrode 21 and the second end of the LED 40 is arranged on the second electrode 22 while the LED 40 is aligned. Therefore, a ratio in which the LED 40 is electrically connected between the first electrodes 21 and the second electrodes 22 may be raised.

Though it is shown that the first and second connection electrodes 61 and 62 cover all of the lateral surfaces and upper surfaces of the first and second partition walls 31*b* and 32*b* in FIG. 7B, this is exemplary and the invention is not limited thereto. According to another exemplary embodiment, since the first and second partition walls 31*b* and 32*b* have an inverse-tapered shape, depending on materials of the first and second connection electrodes 61 and 62, the first and second connection electrodes 61 and 62 may not cover the entire lateral surface of the first and second partition walls 31*b* and 32*b* and may expose at least a portion of the lateral surface of the first and second partition walls 31*b* and 32*b*.

The first and second partition walls 31*b* and 32*b* having a cross-section of an inverse-tapered shape are applicable to the exemplary embodiments illustrated in FIGS. 2, 4A, and 4B.

Figure 8:
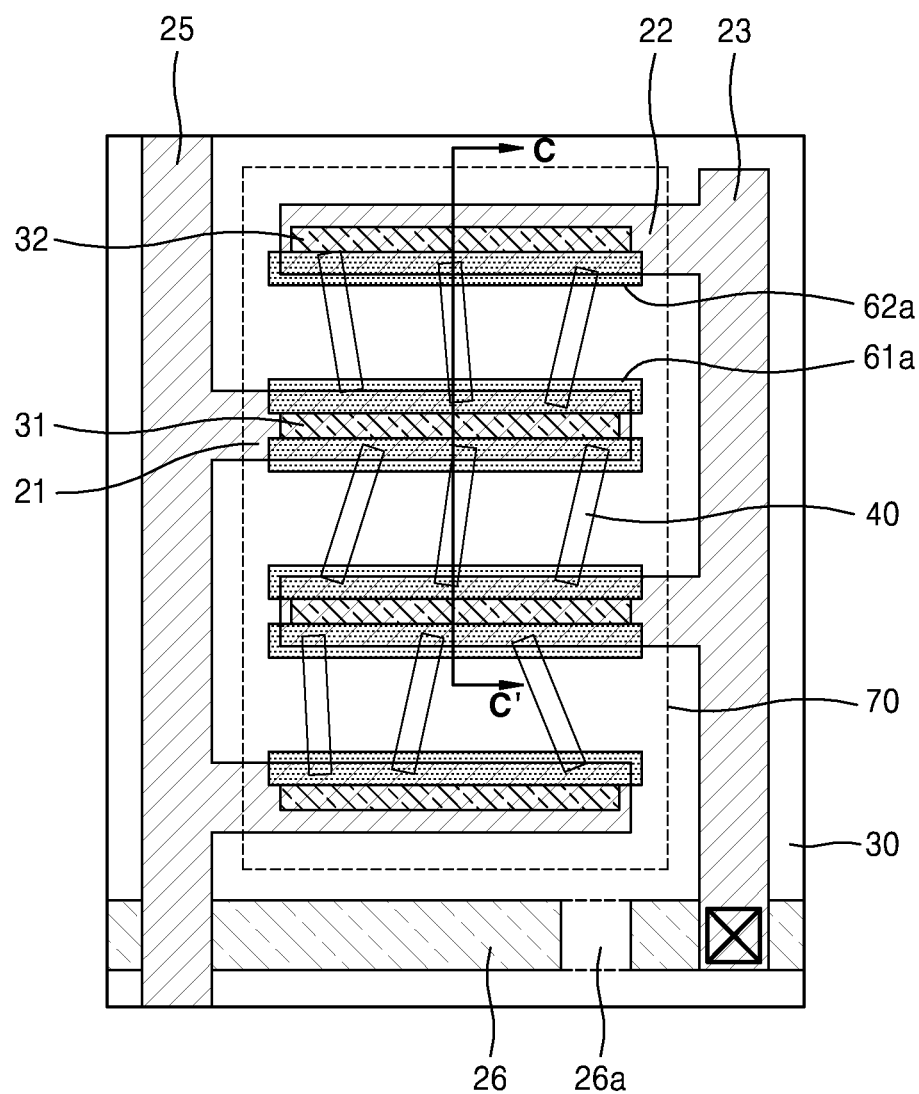
FIG. 8 is a plan view of another exemplary embodiment of a portion of a display area DA.

FIG. 8 is a plan view of a portion of a display area DA according to another exemplary embodiment.

Referring to FIG. 8, one pixel PX (refer to FIG. 1) inside the display area DA is illustrated.

The exemplary embodiment illustrated in FIG. 8 is substantially the same as the exemplary embodiment illustrated in FIG. 6 except for an arrangement of first and second connection electrodes 61*a* and 62*a*. The same elements are not repeatedly described and only differences are mainly described.

The first and second connection electrodes 61*a* and 62*a* may not cover upper surfaces of the first and second partition walls 31 and 32. The first and second connection electrodes 61*a* and 62*a* may not cover at least a portion of lateral surfaces of the first and second partition walls 31 and 32.

The first and second connection electrodes 61*a* and 62*a* may be arranged only on a region in which the first end and the second end of the LED 40 will be arranged. In the first electrode 21 and/or the second electrode 22 arranged in an outermost side among the first electrodes 21 and the second electrodes 22 arranged alternately, only a portion of the electrode in which the LEDs 40 are arranged among portions divided by the first and second partition walls 31 and 32 may be covered by the first and second connection electrodes 61*a* and 62*a*.

Figure 9:
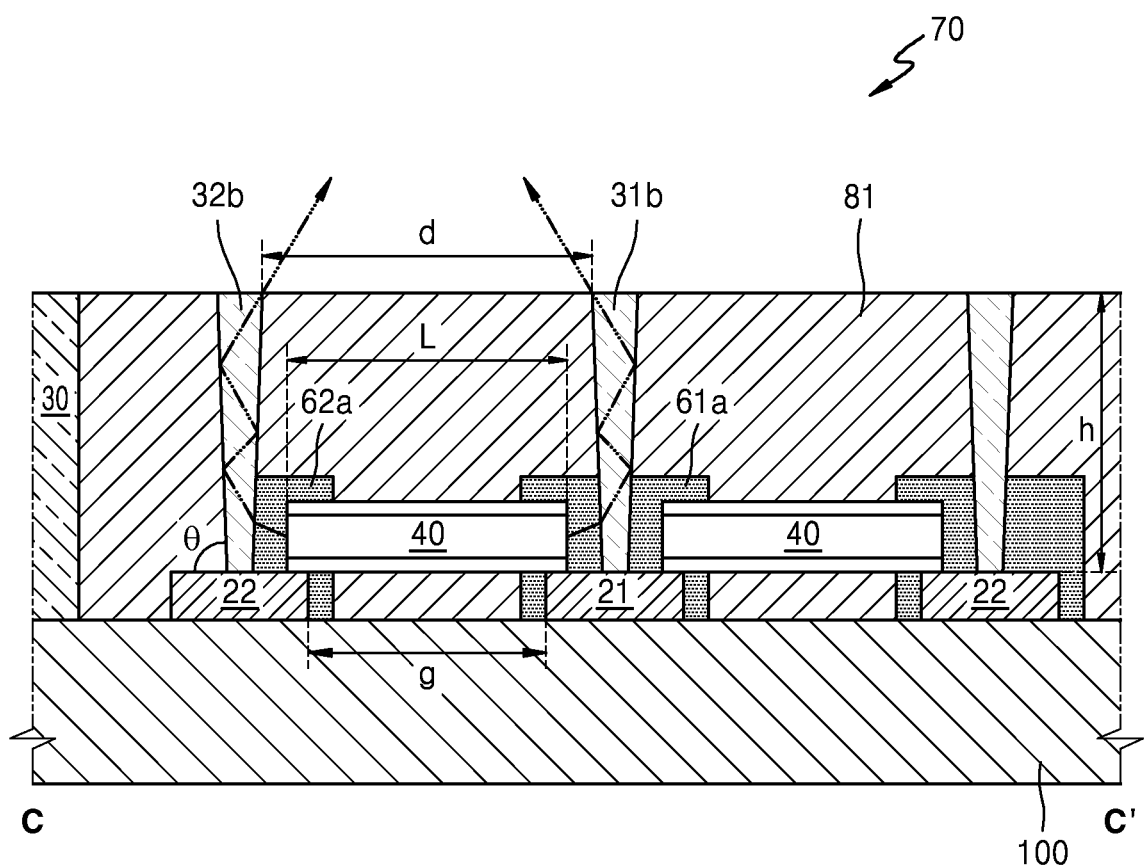
FIG. 9 is a partial cross-sectional view of another exemplary embodiment of the display area taken along line C-C' of FIG. 8.

FIG. 9 is a partial cross-sectional view of the display area taken along line C-C' of FIG. 8 according to another exemplary embodiment.

The exemplary embodiment illustrated in FIG. 9 is substantially the same as the exemplary embodiment illustrated in FIG. 7B except for the first and second connection electrodes 61*a* and 62*a* and a capping layer 81. Same elements are not repeatedly described and only differences are mainly described.

Referring to FIGS. 8 and 9, the first and second connection electrodes 61*a* and 62*a* may not cover upper surfaces and at least a portion of lateral surfaces of the first and second partition walls 31*b* and 32*b*.

In an exemplary embodiment, an angle θ defined by the upper surface of the first and second electrodes 21 and 22 and a lateral surface of the first and second partition wall 31*b* and 32*b* may be an acute angle, for example, about 70°. Therefore, a width, that is, a thickness of a cross-section of the first and second partition walls 31*b* and 32*b* increases in a direction away from the substrate 100, and the cross-section of the first and second partition walls 31*b* and 32*b* may have an inverse-tapered shape from an upper surface of the first and second electrodes 21 and 22.

The pixel-defining layer 30 may be arranged on the substrate 100 and may define an opening exposing the emission region 70 in which the LEDs 40, and the first and second partition walls 31*b* and 32*b* are arranged. The opening of the pixel-defining layer 30 may be filled with the capping layer 81. The capping layer 81 may cover at least an exposed portion of lateral surfaces of the first and second partition walls 31*b* and 32*b* not covered by the first and second connection electrodes 61*a* and 62*a*.

The first and second partition walls 31*b* and 32*b* may include a same material as that of the pixel-defining layer 30. A refractive index of a material of the first and second partition walls 31*b* and 32*b* may be greater than a refractive index of a material of the capping layer 81. Therefore, light incident to, at an incident angle greater than a threshold angle, a boundary surface between the first and second partition walls 31*b* and 32*b* and the capping layer 81 is totally reflected. Since the first and second partition walls 31*b* and 32*b* have a cross-section of an inverse-tapered shape, light totally reflected at the boundary surface between the first and second partition walls 31*b* and 32*b* and the capping layer 81 may be emitted in a front direction, that is, toward an opposite direction of the substrate.

Light emitted from the LED 40 to the lateral direction may be incident to the first and second partition walls 31*b* and 32*b*, and the light incident to the first and second partition walls 31*b* and 32*b* may be totally reflected at the boundary surface between the first and second partition walls 31*b* and 32*b* and the capping layer 81 and emitted in the front direction. Therefore, the display device according to the exemplary embodiment illustrated in FIG. 9 may have improved light extraction efficiency.

In the case where the refractive index of the material of the first and second partition walls 31b and 32b is less than the refractive index of the material of the capping layer 81, or the first and second partition walls 31b and 32b do not have a cross-section of an inverse-tapered shape, light emitted from the LED 40 to the lateral direction may be mixed with light emitted from an adjacent pixel PX through the pixel-defining layer 30 and may reduce a display image quality of the display device.

FIGS. 10A to 10I are cross-sectional views of a process of manufacturing a display device illustrated in FIGS. 2 and 4B according to an exemplary embodiment.

Figure 10A:
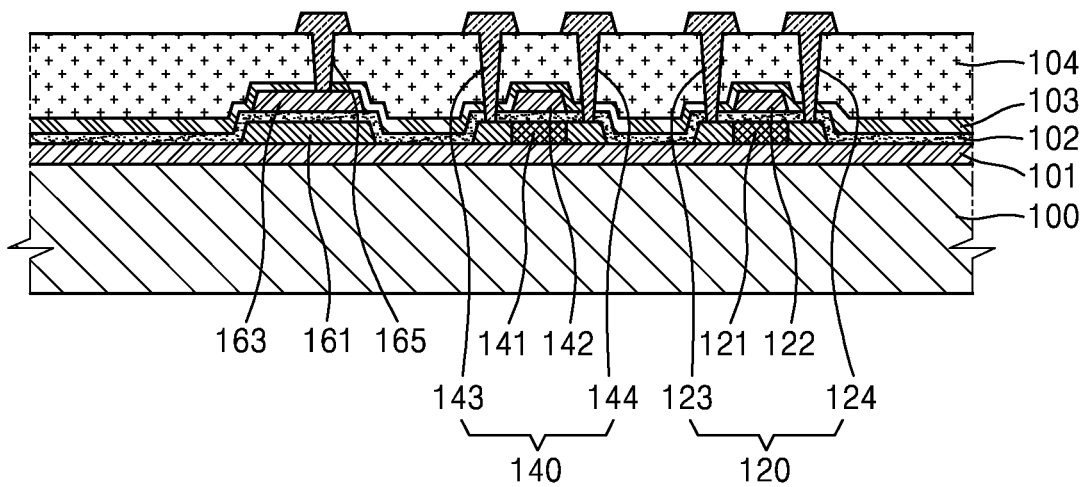
FIGS. 10A to 10I are cross-sectional views of an exemplary embodiment of a process of manufacturing a display device illustrated in FIGS. 2 and 4B.

Referring to FIG. 10A, a pixel circuit including at least one TFT and at least one capacitor may be provided over the substrate 100.

In an exemplary embodiment, the substrate 100 may include various materials such as glass, metal, or plastic. According to an exemplary embodiment, the substrate 100 may include a substrate including a flexible material. Here, the substrate of the flexible material denotes a readily wrapped and bent and foldable or rollable substrate. In an exemplary embodiment, the substrate of the flexible material may include ultrathin glass, metal, or plastic, for example.

The buffer layer 101 may be disposed on the substrate 100. In an exemplary embodiment, the buffer layer 101 may prevent impurity elements from passing through the substrate 100 and penetrating to the pixel circuit, planarize a surface of the substrate 100, and include a single layer or a multi-layer including an inorganic insulating material such as SiNx and/or SiOx. In another exemplary embodiment, the buffer layer 101 may be omitted.

The first TFT 120 and the second TFT 140 may be disposed on the buffer layer 101. The first TFT 120 may include the first active layer 121, the first gate electrode 122, the first drain electrode 123, and the first source electrode 124. The second TFT 140 may include the second active layer 141, the second gate electrode 142, the second drain electrode 143, and the second source electrode 144.

The first active layer 121 and the second active layer 141 may be disposed on the buffer layer 101 by a semiconductor material. The semiconductor material may be an inorganic semiconductor material such as amorphous silicon or polycrystalline silicon, an organic semiconductor material, or an oxide semiconductor material. The first active layer 121 and the second active layer 141 may include a drain region and a source region doped with B or P ions, for example, and a channel region therebetween.

The first gate insulating layer 102 may be arranged on the buffer layer 101 to cover the first active layer 121 and the second active layer 141.

In an exemplary embodiment, the first gate electrode 122 and the second gate electrode 142 may include a single layer or a multi-layer including one or more materials among Al, Pt, Pd, Ag, Mg, Au, Ni, Nd, Jr, Cr, Li, Ca, Mo, Ti, W, and Cu, for example.

The second gate insulating layer 103 may be arranged on the first gate insulating layer 102 to cover the first gate electrode 122 and the second gate electrode 142.

The first gate insulating layer 102 and the second gate insulating layer 103 may include a single layer or a multi-layer including an inorganic insulating material. In an exemplary embodiment, the first gate insulating layer 102 may include $SiO_2$, SiNx, SiON, $Al_2O_3$, $TiO_2$, $Ta_2O_5$, $HfO_2$, and/or $ZrO_2$, for example.

The inter-insulating layer 104 may include a single layer or a multi-layer including an organic insulating material on the second gate insulating layer 103. The inter-insulating layer 104 may include a single layer or a multi-layer including an inorganic insulating material. In another exemplary embodiment, one of the second gate insulating layer 103 and the inter-insulating layer 104 may be omitted.

The first drain electrode 123 and the first source electrode 124, and the second drain electrode 143 and the second source electrode 144 may be disposed on the inter-insulating layer 104. The first drain electrode 123 and the first source electrode 124 may be respectively connected to the drain region and the source region of the active layer 121 through contact plugs passing through the first gate insulating layer 102, the second gate insulating layer 103, and the inter-insulating layer 104. The second drain electrode 143 and the second source electrode 144 may be respectively connected to the drain region and the source region of the active layer 141 through contact plugs passing through the first gate insulating layer 102, the second gate insulating layer 103, and the inter-insulating layer 104.

The first drain electrode 123 and the first source electrode 124, and the second drain electrode 143 and the second source electrode 144 may include a same material as that of the first and second gate electrodes 122 and 142. In an exemplary embodiment, the first drain electrode 123 and the first source electrode 124, and the second drain electrode 143 and the second source electrode 144 may include metal, an alloy, a metal nitride, a conductive metal oxide, a transparent conductive material, etc.

The capacitor lower electrode 161 may be disposed on the buffer layer 101. The capacitor lower electrode 161 may be provided simultaneously with the first active layer 121 and the second active layer 141 by a same material as that of the first active layer 121 and the second active layer 141. However, the invention is not limited thereto and the capacitor lower electrode 161 may be provided during a process different from a process of the first active layer 121 and the second active layer 141 by a material different from the material of the first active layer 121 and the second active layer 141.

The first gate insulating layer 102 may cover the capacitor lower electrode 161, and the capacitor upper electrode 163 overlapping the capacitor lower electrode 161 may be disposed on the first gate insulating layer 102. The capacitor upper electrode 163 may be provided simultaneously with the first and second gate electrodes 122 and 142 by a same material as that of the first and second gate electrodes 122 and 142. However, the invention is not limited thereto and the capacitor upper electrode 163 may be provided during a process different from a process of the first and second gate electrodes 122 and 142 by a material different from that of the first and second gate electrodes 122 and 142.

The second gate insulating layer 103 and the inter-insulating layer 104 may be arranged on the capacitor upper electrode 163, and the connection wiring 165 may be disposed on the inter-insulating layer 104. The connection wiring 165 may be electrically connected to the capacitor upper electrode 163 through a contact plug passing through the second gate insulating layer 103 and the inter-insulating layer 104. The connection wiring 165 may be provided simultaneously with the first drain electrode 123 and the first source electrode 124, and the second drain electrode 143 and the second source electrode 144 by a same material as that of the first drain electrode 123 and the first source electrode 124, and the second drain electrode 143 and the second source electrode 144. Though not shown, the connection wiring 165 may be electrically connected to one of the first drain electrode 123, the first source electrode 124, the second drain electrode 143, and the second source electrode

144. In an exemplary embodiment, the capacitor upper electrode 163 may be electrically connected to the first source electrode 124 through the connection wiring 165, for example.

Though not shown in FIG. 10A, according to an exemplary embodiment, the second power wiring 26 (refer to FIG. 2) may be disposed on the inter-insulating layer 104. The second power wiring 26 may be provided during a same process as that of the connection wiring 165 by a same material as that of the connection wiring 165.

Figure 10B:
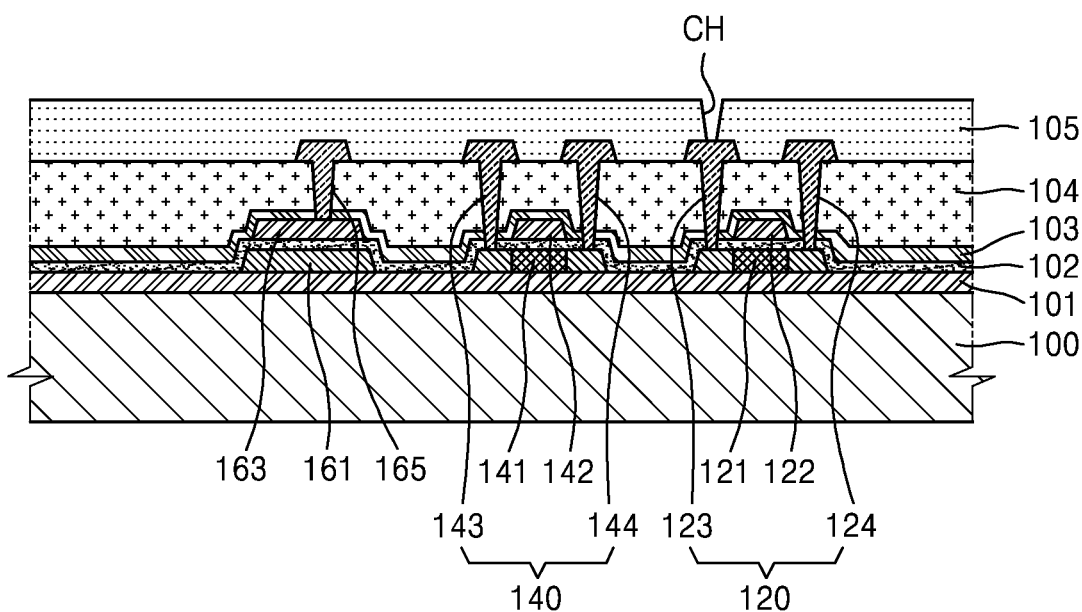

Referring to FIG. 10B, a passivation layer 105 covering the first and second TFTs 120 and 140 may be disposed on the inter-insulating layer 104. The passivation layer 105 may include a single layer or a multi-layer including an organic insulating material or an inorganic insulating material. The passivation layer 105 may be provided by alternating an organic insulating material and an inorganic insulating material.

A contact hole CH exposing a portion of the first drain electrode 123 of the first TFT 120 may be defined in the passivation layer 105. Though not shown in FIG. 10B, a contact hole exposing a portion of the second power wiring 26 may be defined in the passivation layer 105.

Figure 10C:
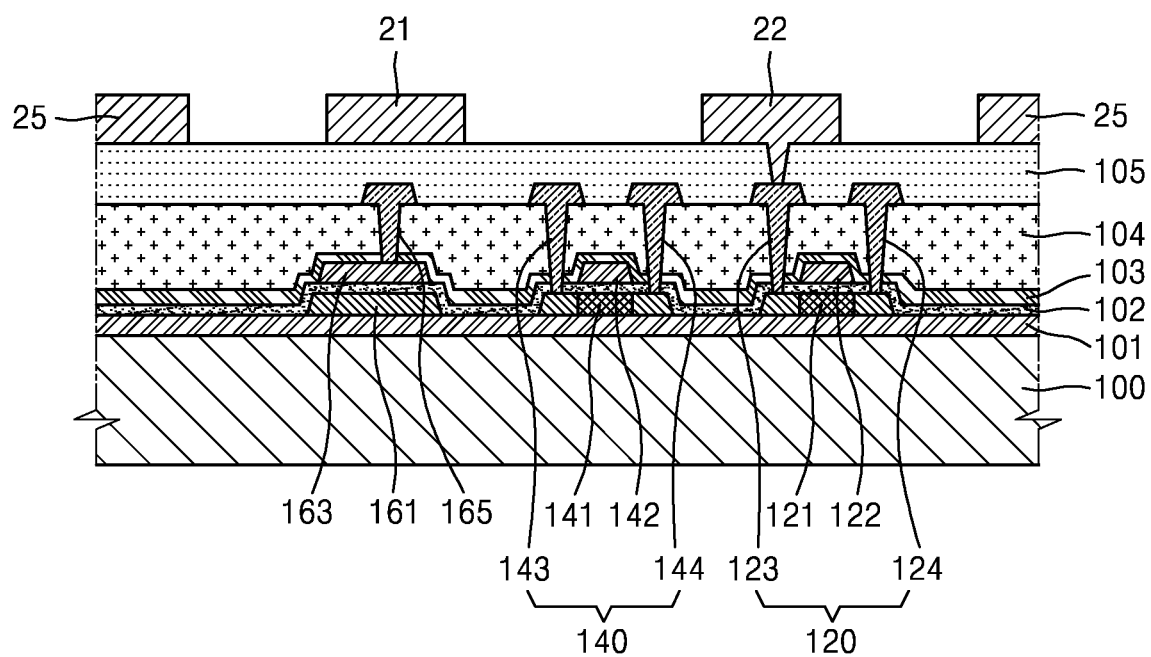

Referring to FIG. 10C, the first electrode 21, the second electrode 22, and the first power wiring 25 may be disposed on the passivation layer 105.

A first conductive layer may be disposed on the passivation layer 105.

In an exemplary embodiment, the first conductive layer may be a transparent conductive layer including at least one transparent conductive oxide among indium tin oxide ("ITO"), indium zinc oxide ("IZO"), zinc oxide (ZnO), indium oxide ($In_2O_3$), indium gallium oxide ("IGO"), and aluminum zinc oxide ("AZO"), for example. In an exemplary embodiment, the first conductive layer may include at least one metal among Ag, Mg, Al, Pt, Pd, Au, Ni, Nd, Jr, Cr, Li, Ca, Mo, Ti, W, Cu, and an alloy thereof, for example. The first conductive layer may fill the contact hole CH defined in the passivation layer 105.

The first electrode 21, the second electrode 22, and the first power wiring 25 may be provided by performing photolithography on the first conductive layer.

The second electrode 22 may be electrically connected to the first drain electrode 123 of the first TFT 120 in the lower layer. Though not shown, the second electrode 22 may be electrically connected to the second power wiring 26 of the lower layer through a contact plug.

Figure 10D:
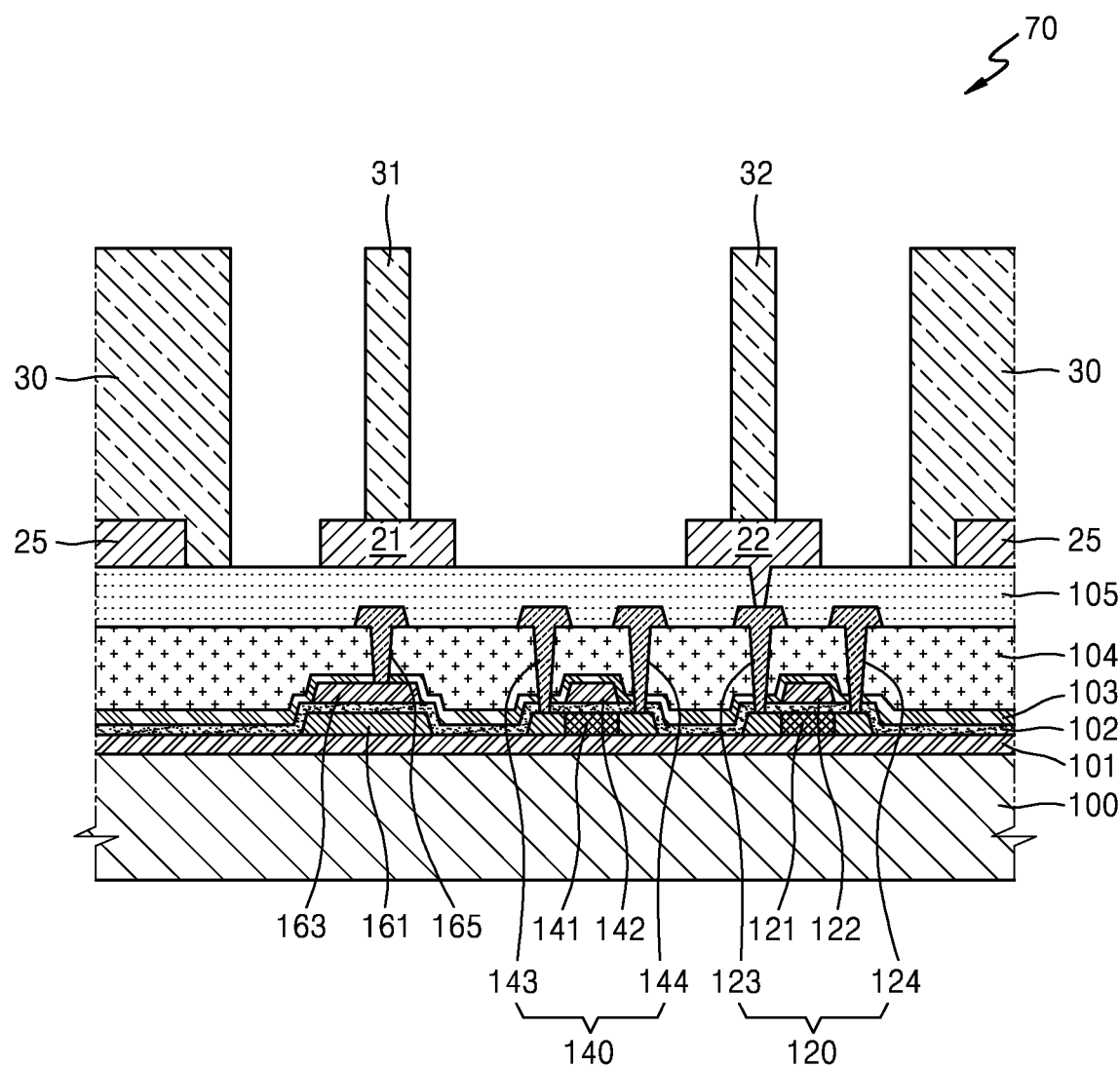

Referring to FIG. 10D, the first and second partition walls 31 and 32 may be respectively disposed on the first and second electrodes 21 and 22, and the pixel-defining layer 30 may be provided outside the emission region 70 in which the first and second electrodes 21 and 22 are provided.

An organic insulating layer may be disposed entirely on the substrate 100. An opening exposing the emission region 70 and the first and second partition walls 31 and 32 may be defined by performing a photolithography process on the organic insulating layer.

According to another exemplary embodiment, a photosensitive organic insulating layer may be provided by coating a photosensitive organic insulating layer entirely on the substrate 100 and then performing soft bake on the photosensitive organic insulating layer. A photosensitive organic pattern may be provided by aligning a mask on the photosensitive organic insulating layer, then exposing the photosensitive insulating layer to light through the mask, and developing the same. The first and second partition walls 31 and 32, and the pixel-defining layer 30 including the photosensitive organic insulating material may be provided by performing hard bake on the photosensitive organic pattern. The first and second partition walls 31 and 32 may be simultaneously provided during a same process as that of the pixel-defining layer 30 by a same material as that of the pixel-defining layer 30.

A slope angle of the lateral surface of the first and second partition walls 31 and 32 may be adjusted by adjusting exposure energy and a focal position of an exposure beam when exposing the photosensitive organic insulating layer to light. In an exemplary embodiment, when exposure energy is raised, a slope angle of the lateral surface of the first and second partition walls 31 and 32 becomes smaller than 90°, and thereby the first and second partition walls 31 and 32 having a cross-section of an inverse-tapered shape may be provided, for example. When a focal position of an exposure beam is offset, a slope angle of the lateral surface of the first and second partition walls 31 and 32 becomes greater than 90°, and thereby the first and second partition walls 31 and 32 having a cross-section of a tapered shape may be provided.

Figure 10E:
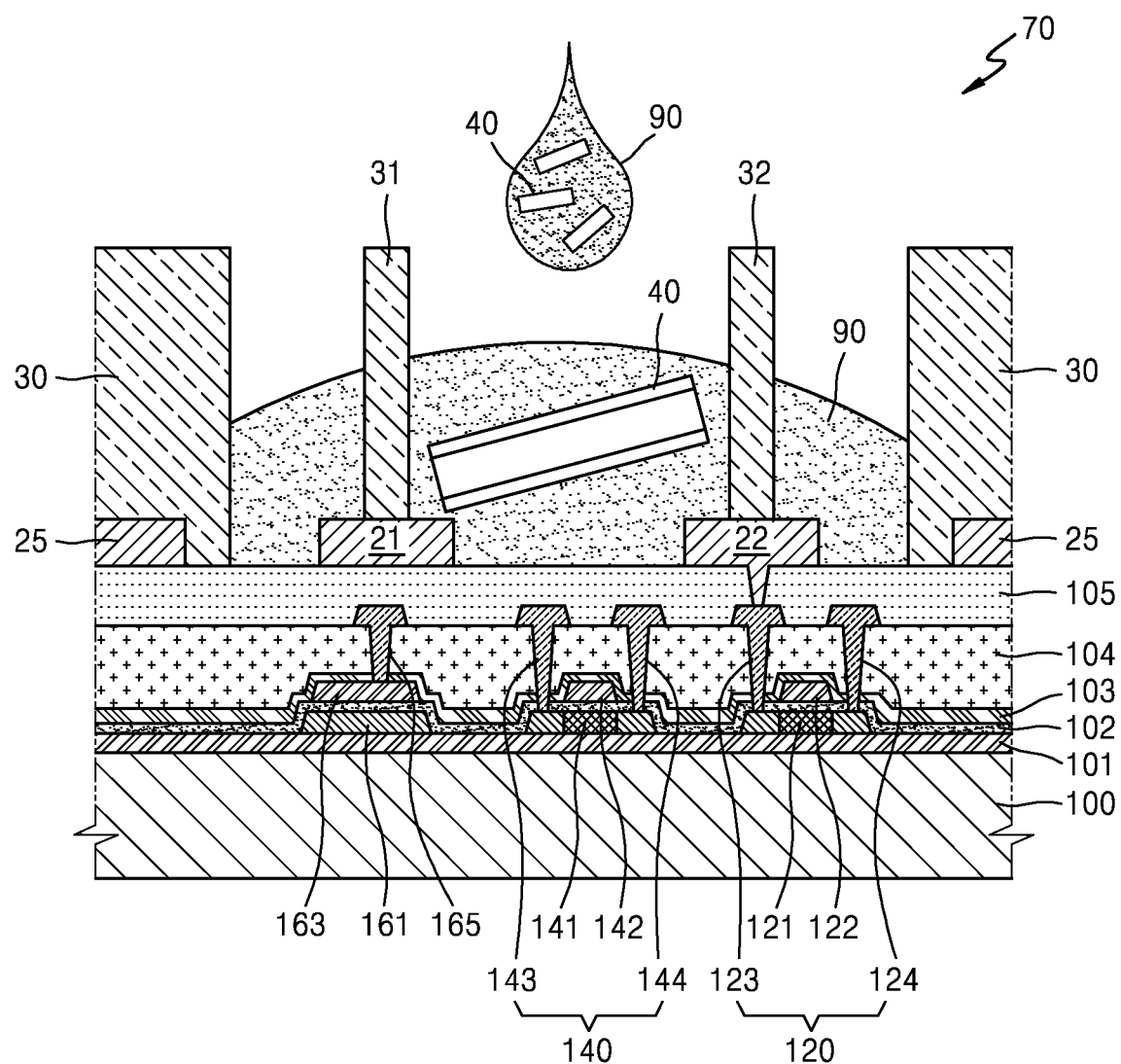

Referring to FIG. 10E, the LEDs 40 may be transferred onto the first electrode 21 and the second electrode 22 by putting a solvent 90 including the LEDs 40 to the emission region 70.

In an exemplary embodiment, the solvent 90 may be one or more among acetone, water, and toluene, for example, but is not limited thereto. In an exemplary embodiment, the solvent 90 may be a material which may be evaporated by room temperature or heat, for example. In an exemplary embodiment, the solvent 90 may be in the form of ink or paste.

Figure 11:
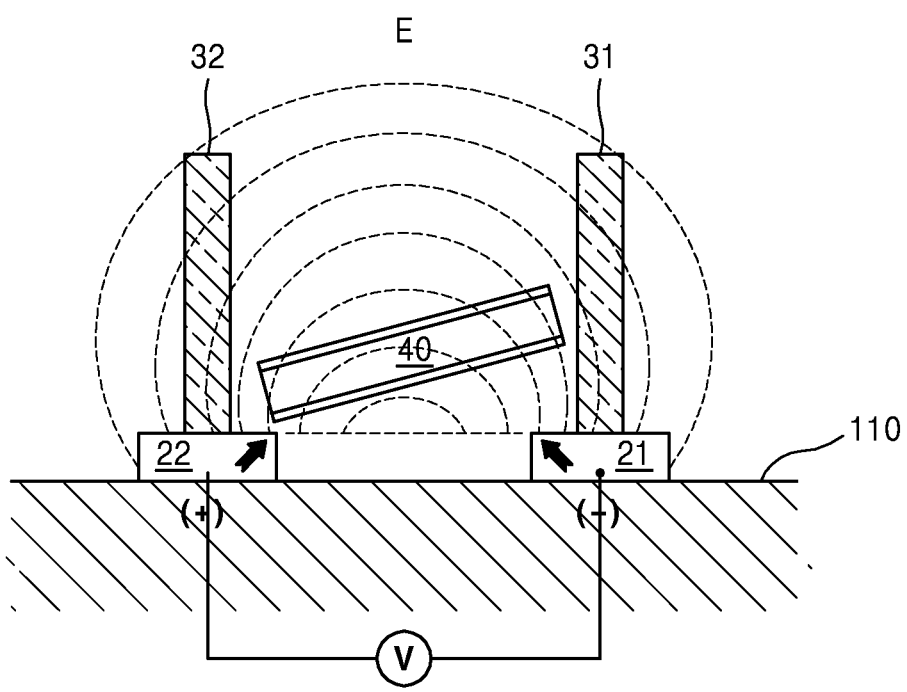
FIG. 11 is a cross-sectional view for explaining an exemplary embodiment of a process of self-aligning of an LED.

FIG. 11 is a cross-sectional view for explaining a process of self-aligning of a light-emitting diode according to an exemplary embodiment. An electric field E may be generated between the first electrode 21 and the second electrode 22 by applying power V between the first power wiring 25 (refer to FIGS. 2, 6 and 8) connected to the first electrode 21 and the second power wiring 26 (refer to FIGS. 2, 6 and 8) connected to the second electrode 22. The power V may be an external supply source or an inner power source of the display device 1. The power V may be an alternating current power source including a preset amplitude and a preset period, or a direct current power source. The direct current power source may be repeatedly applied between the first electrode 21 and the second electrode 22 such that the power V has a waveform having a preset amplitude and a preset period.

When the power V is applied between the first power wiring 25 and the second power wiring 26, a potential difference occurs by electric polarities of the power V respectively applied to the first power wiring 25 and the second power wiring 26, and the electric field E is generated between the first electrode 21 and the second electrode 22. Dipolarity is induced to the LED 40 by non-uniform electric field E, and the LED 40 is given force directed to a side in which a gradient of the electric field E is large or a side in which a gradient of the electric field E is small by the DEP force. The electric field E is strong at an edge of the first electrode 21 and the second electrode 22, and accordingly, strong DEP force acts thereon. Therefore, the LED 40 is given DEP force such that the first end is arranged on the first electrode 21 and the second end is arranged on the second electrode 22.

An insulating plane 110 illustrated in FIG. 11 may be an upper surface of the insulating substrate 100 illustrated in FIG. 4A or an upper surface of the insulating layer 105 arranged on the substrate 100 as illustrated in FIG. 4B.

According to another exemplary embodiment, the second power wiring 26 may be omitted. In this case, a first polarity of the power V may be applied to the first power wiring 25, and a second polarity of the power V may be applied to the second electrode 22 through a pixel circuit.

Figure 10F:
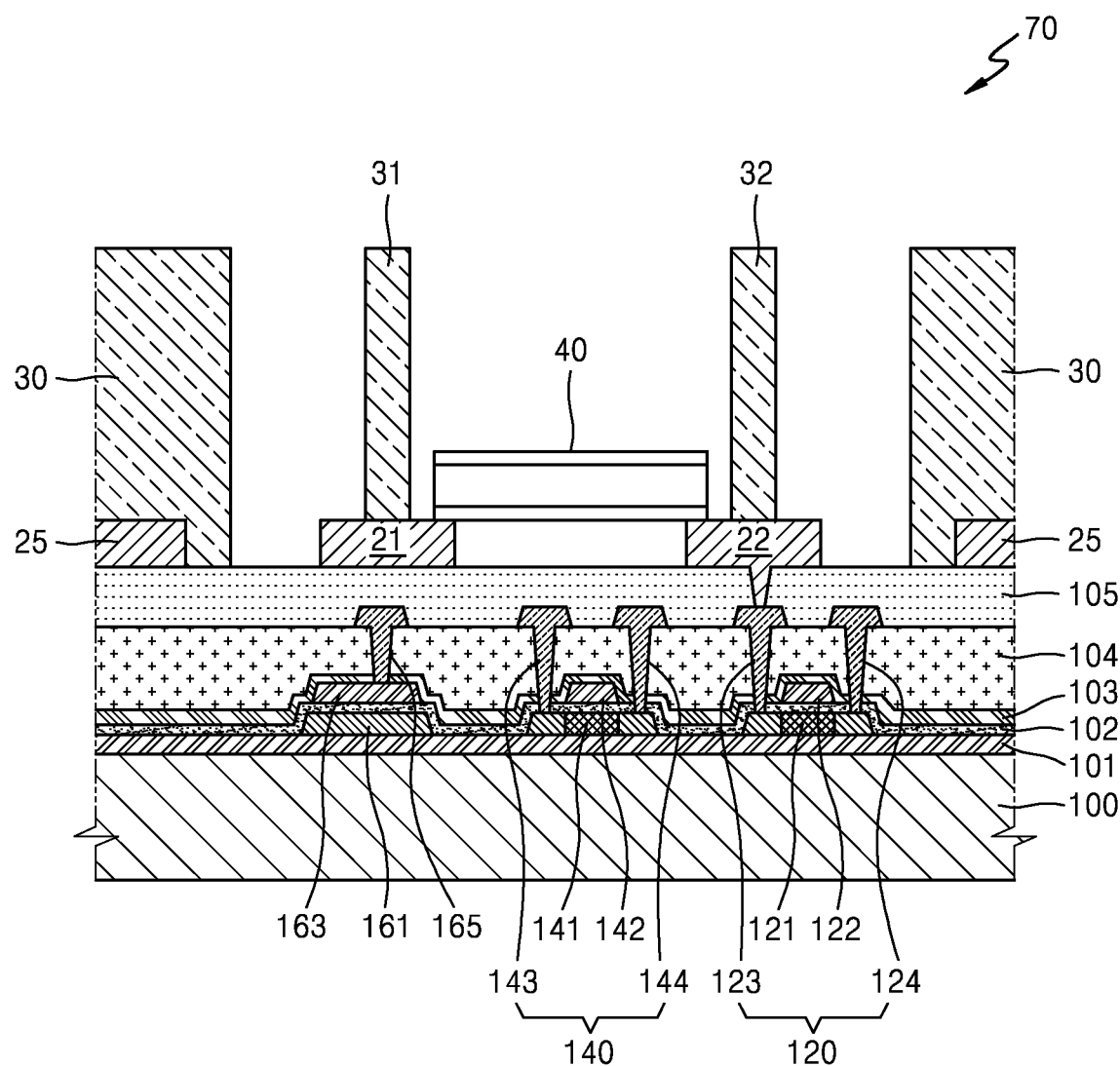

Referring to FIG. 10F, the solvent 90 may be evaporated by room temperature or heat, and the LED 40 may be self-aligned on the first electrode 21 and the second electrode 22 by DEP force. The first end and the second end of the LED 40 may respectively surface-contact an upper surface of the first electrode 21 and an upper surface of the second electrode 22.

Figure 10G:
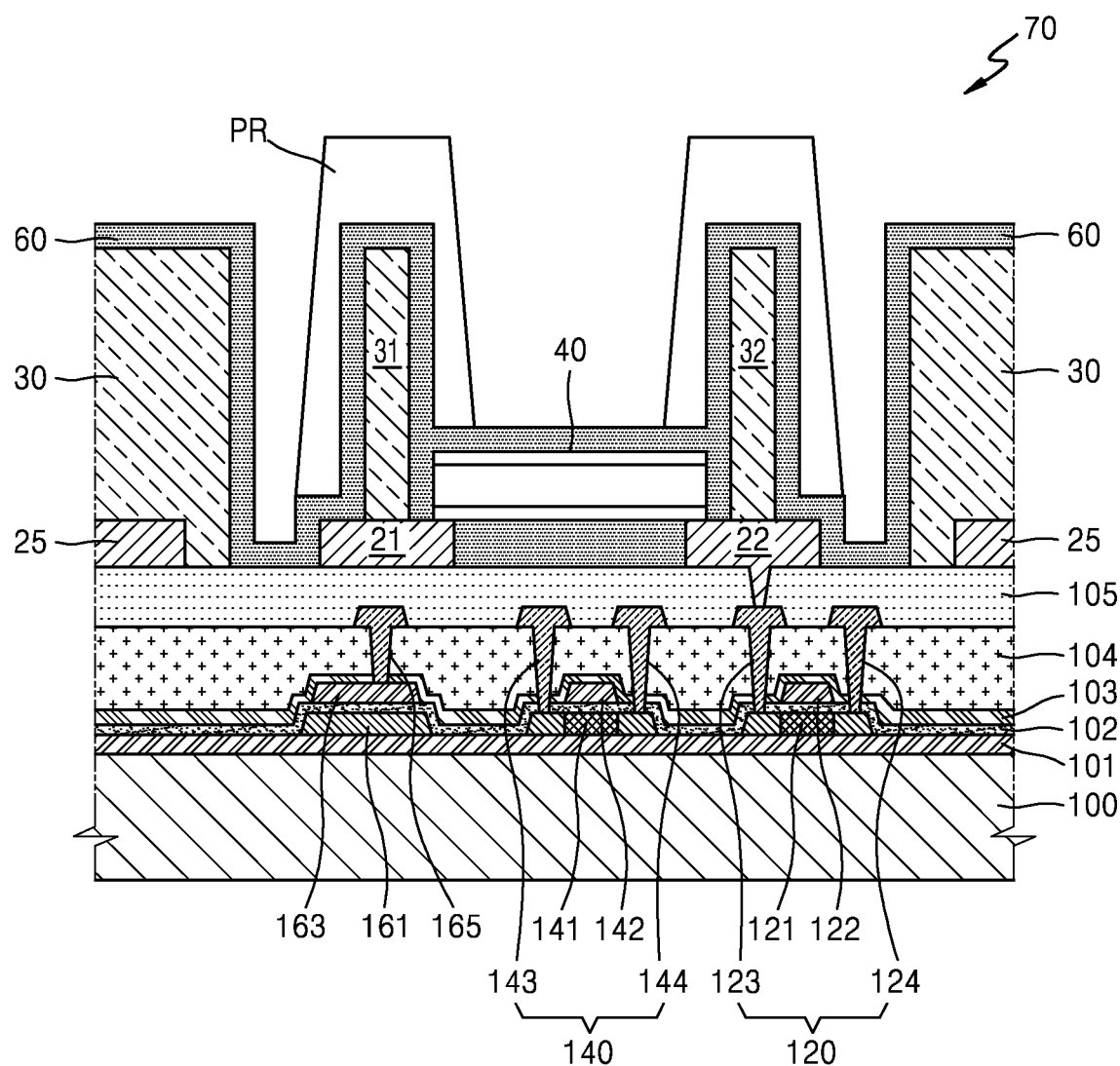

Referring to FIG. 10G, a second conductive layer 60 and a photoresist layer PR are sequentially stacked entirely over the substrate 100, and the photoresist layer PR may be patterned by a mask (not shown). Some region of the photoresist layer PR is removed and only a region corresponding to the first and second connection electrodes 61 and 62 (refer to FIG. 10H) may remain. According to another exemplary embodiment, the second conductive layer 60 may be provided inside the opening of the pixel-defining layer 30, that is, inside the emission region 70.

In an exemplary embodiment, the second conductive layer 60 may be a transparent conductive layer including at least one transparent conductive oxide among ITO, IZO, ZnO, $In_2O_3$, IGO, and AZO, for example. In an exemplary embodiment, the second conductive layer 60 may be metal including one of Ag, Mg, Al, Pt, Pd, Au, Ni, Nd, Ir, Cr, and a combination thereof, for example. The photoresist layer PR may be a positive or negative photosensitive organic material.

Figure 10H:
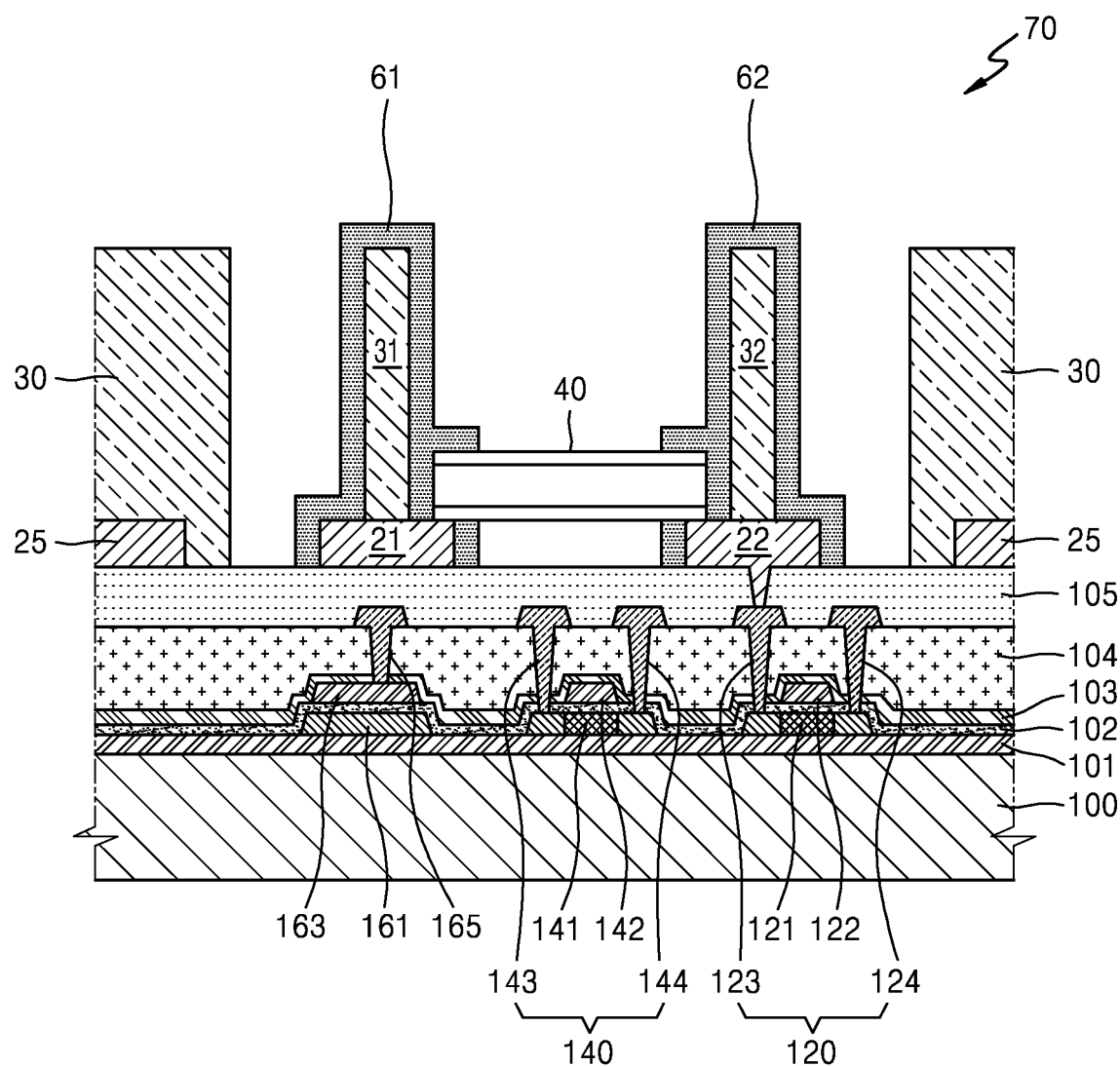

Referring to FIG. 10H, the first connection electrode 61 and the second connection electrode 62 may be provided by patterning the second conductive layer 60 by the patterned photoresist layer PR as a mask.

The first and second connection electrodes 61 and 62 may cover the first and second electrodes 21 and 22, the first and second partition walls 31 and 32, and the first and second ends of the LED 40. The first connection electrode 61 electrically connects the first end of the LED 40 to the first electrode 21, and the second connection electrode 62 electrically connects the second end of the LED 40 to the second electrode 22.

A conductive material of the second conductive layer 60 remaining between the LED 40 and the passivation layer 105 may be removed by performing wet etching during a patterning process of the second conductive layer 60.

After the LED 40 is arranged on the first and second electrodes 21 and 22 by self-alignment and electrically connected between the first and second electrodes 21 and 22 by the first and second connection electrodes 61 and 62, the opening 26a illustrated in FIG. 2 may be defined in the second power wiring 26 to divide the second power wiring 26 for each pixel. The second power wiring 26 may be divided into power electrodes by the opening 26a, the power electrodes being spaced apart from each other in the row direction. The power electrode is connected to the second electrode 22 of a corresponding pixel.

According to an example, the opening 26a may be defined by removing a portion of the second power wiring 26 with a laser. According to another exemplary embodiment, the opening 26a may be defined by forming, in the passivation layer 105, a contact hole exposing a portion of the second power wiring 26 corresponding to the opening 26a, and removing the portion of the second power wiring 26 exposed by the contact hole during the patterning process of the second conductive layer 60.

Figure 10I:
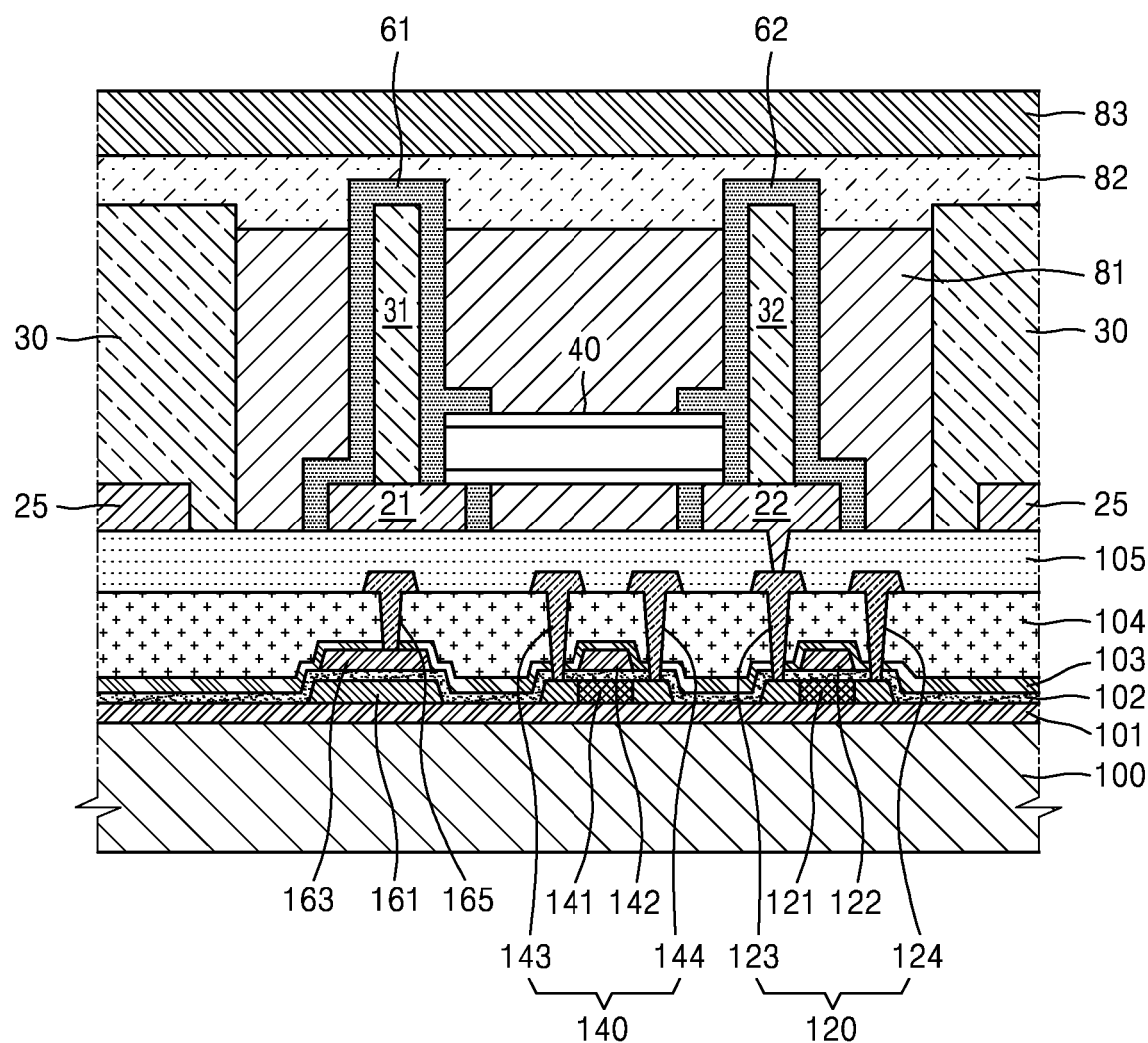

Referring to FIG. 10I, the capping layer 81 may be provided to cover the emission region 70. The capping layer 81 may be allowed not to deteriorate light extraction efficiency by making the capping layer 81 transparent or semi-transparent with respect to a visible wavelength. In an exemplary embodiment, the capping layer 81 may include an organic insulating material, for example, an epoxy, poly (methyl methacrylate) ("PMMA"), benzocyclobutene ("BCB"), polyimide, and polyester, but is not limited thereto.

A refractive index of a material of the capping layer 81 may be less than a refractive index of a material of the first and second partition walls 31b and 32b (refer to FIG. 9). Light incident, at an incident angle greater than a threshold, to a boundary surface between the first and second partition walls 31b and 32b and the capping layer 81 is totally reflected. In the case where the first and second partition walls 31b and 32b have a cross-section of an inverse-tapered shape, light totally reflected at the boundary surface between the first and second partition walls 31b and 32b and the capping layer 81 may be emitted in a front direction, that is, toward an opposite direction of the substrate.

An optical layer 82 and a protective layer 83 may be sequentially disposed on the capping layer 81. The optical layer 82 blocking external light may be disposed on the capping layer 81. According to an exemplary embodiment, the optical layer 82 may be an RGB color filter corresponding to light emitted from a pixel PX. The color filter may be provided by patterning a color photoresist layer or spraying color ink. According to another exemplary embodiment, the optical layer 82 may be a polarization plate.

The protective layer 83 may be disposed on the optical layer 82. The protective layer 83 may include an encapsulation function and may be provided over an entire surface of the substrate 100. The protective layer 83 may include an organic material or an inorganic material, or may be provided by alternating the organic material and the inorganic material.

In the exemplary embodiments, an arrangement of the first and second electrodes is not limited to the exemplary embodiments illustrated in FIGS. 2 and 6, and may have various layouts depending on a size and density of the LEDs.

According to various embodiments, an alignment degree of an ultraminiature LED may be raised by arranging partition walls which may prevent misalignment of the ultraminiature LED on a pair of electrodes. Also, a display device which has improved light extraction efficiency by partition walls of an inverse-tapered shape may be provided.

Although the invention has been described with reference to the exemplary embodiments illustrated in the drawings, this is merely provided as an example and it will be understood by those of ordinary skill in the art that various changes in form and details and equivalents thereof may be made therein without departing from the spirit and scope of the invention as defined by the following claims.

What is claimed is:
1. A display device comprising:
  a substrate;
  a first electrode on a surface of the substrate;
  a first structure on the first electrode;
  a second electrode on the surface of the substrate and spaced apart from the first electrode;
  a second structure on the second electrode; and a light-emitting diode on the first electrode and the second electrode, wherein each of the first structure and the second structure comprises an organic insulating material, wherein the light-emitting diode is spaced apart from the first structure and the second structure, wherein a height of an upper surface of the first structure and the second structure from the surface of the substrate is greater than a height of an upper surface of the light-emitting diode from the surface of the substrate, wherein the light-emitting diode overlaps the first electrode in a direction perpendicular to the surface of the substrate, and wherein the light-emitting diode overlaps the second electrode in the direction perpendicular to the surface of the substrate.

2. The display device of claim 1, wherein an interval between the first electrode and the second electrode is less than a length of the light-emitting diode.

3. The display device of claim 1, wherein an interval between the first structure and the second structure is greater than a length of the light-emitting diode.

4. The display device of claim 1, wherein a width of a cross-section of the first structure and the second structure is not reduced in a direction that extends away from the substrate.

5. The display device of claim 1, wherein a first width of the upper surface of the first structure and the second structure is greater than a second width of a lower surface of the first structure and the second structure.

6. The display device of claim 1, wherein scattering particles are dispersed in the organic insulating material.

7. The display device of claim 1, further comprising:
a first connection electrode on the first electrode; and
a second connection electrode on the second electrode.

8. The display device of claim 7, wherein the first connection electrode contacts the first electrode and a first end of the light-emitting diode, and
the second connection electrode contacts the second electrode and a second end of the light-emitting diode opposite to the first end.

9. The display device of claim 7,
wherein at least a portion of the first connection electrode is on the first structure, and
wherein at least a portion of the second connection electrode is on the second structure.

10. The display device of claim 1, further comprising:
a pixel-defining layer over the substrate and in which an opening exposing an emission region is defined,
wherein the light-emitting diode, the first structure, and the second structure are arranged in the emission region.

11. A display device comprising:
a substrate;
a first electrode on a surface of the substrate;
a first structure on the first electrode;
a second electrode on the surface of the substrate and spaced apart from the first electrode;
a second structure on the second electrode;
a light-emitting diode on the first electrode and the second electrode; and
a pixel-defining layer over the substrate and in which an opening exposing an emission region is defined,
wherein the light-emitting diode, the first structure, and the second structure are arranged in the emission region,
wherein the light-emitting diode is spaced apart from the first structure and the second structure,
wherein a height of an upper surface of the first structure and the second structure from the surface of the substrate is greater than a height of an upper surface of the light-emitting diode from the surface of the substrate,
wherein the light-emitting diode overlaps the first electrode in a direction perpendicular to the surface of the substrate,
wherein the light-emitting diode overlaps the second electrode in the direction perpendicular to the surface of the substrate, and
wherein the first structure and the second structure comprise a same material as that of the pixel-defining layer.

12. The display device of claim 10, further comprising:
a capping layer filling the opening of the pixel-defining layer and covering lateral surfaces of the first structure and the second structure.

13. The display device of claim 12, wherein a refractive index of a material of the first structure and the second structure is greater than a refractive index of a material of the capping layer.

14. A display device comprising:
a substrate;
a first electrode on a surface of the substrate;
a first structure on the first electrode;
a second electrode on the surface of the substrate and spaced apart from the first electrode;
a second structure on the second electrode; and
a light-emitting diode on the first electrode and the second electrode,
wherein each of the first structure and the second structure comprises an organic insulating material,
wherein the light-emitting diode is spaced apart from the first structure and the second structure,
wherein a height of an upper surface of the first structure and the second structure from the surface of the substrate is greater than a height of an upper surface of the light-emitting diode from the surface of the substrate, and
wherein the light-emitting diode overlaps a space between the first electrode and the second electrode.

15. The display device of claim 14, wherein the light-emitting diode overlaps the first electrode in a direction perpendicular to the surface of the substrate, and
wherein the light-emitting diode overlaps the second electrode in the direction perpendicular to the surface of the substrate.

* * * * *